US011985858B2

(12) United States Patent
Lim et al.

(10) Patent No.: US 11,985,858 B2
(45) Date of Patent: May 14, 2024

(54) DISPLAY DEVICE

(71) Applicant: LG Display Co., Ltd., Seoul (KR)

(72) Inventors: Kyoung-Nam Lim, Gyeongsangbuk-do (KR); Yu-Ho Jung, Paju-si (KR); Dong-Young Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/218,549

(22) Filed: Jul. 5, 2023

(65) Prior Publication Data
US 2023/0354646 A1   Nov. 2, 2023

Related U.S. Application Data

(63) Continuation of application No. 17/953,571, filed on Sep. 27, 2022, now Pat. No. 11,765,937, which is a
(Continued)

(30) Foreign Application Priority Data

Dec. 19, 2017 (KR) .......................... 10-2017-0175053

(51) Int. Cl.
*H10K 59/121* (2023.01)
*H01L 27/12* (2006.01)
(Continued)

(52) U.S. Cl.
CPC ..... *H10K 59/1213* (2023.02); *H10K 59/1216* (2023.02); *H10K 59/123* (2023.02);
(Continued)

(58) Field of Classification Search
CPC ........... H10K 59/1213; H10K 59/1216; H10K 59/123; H10K 59/124; H10K 59/126;
(Continued)

(56) References Cited

U.S. PATENT DOCUMENTS 7,274,345 B2   9/2007   Imamura et al.
9,082,667 B2   7/2015   Youn et al.
(Continued)

FOREIGN PATENT DOCUMENTS

CN        1551059 A      12/2004
CN      104332485 A       2/2015
(Continued)

OTHER PUBLICATIONS

China National Intellectual Property Administration, Notice of Allowance, Chinese Patent Application No. 201811494524.5, dated Jun. 30, 2023, 10 pages.
(Continued)

*Primary Examiner* — Caleb E Henry
(74) *Attorney, Agent, or Firm* — Fenwick & West LLP

(57) ABSTRACT

Disclosed is a display device that is capable of being driven with low power consumption. A first thin-film transistor including a polycrystalline semiconductor layer and a second thin-film transistor including an oxide semiconductor layer are disposed in an active area, thereby reducing power consumption. At least one opening formed in a bending area is formed to have the same depth as any one of contact holes formed in the active area, thereby making it possible to form the opening and the contact holes through the same process and consequently simplifying the process of manufacturing the device. Since a high potential supply line and a low potential supply line overlap each other with a protective film formed of an inorganic insulation material interposed therebetween, short-circuiting of the high potential supply line and the low potential supply line may be prevented.

13 Claims, 24 Drawing Sheets

Related U.S. Application Data continuation of application No. 17/227,011, filed on Apr. 9, 2021, now Pat. No. 11,489,030, which is a continuation of application No. 16/206,802, filed on Nov. 30, 2018, now Pat. No. 11,004,923.

(51) Int. Cl.
*H01L 29/786* (2006.01)
*H10K 59/123* (2023.01)
*H10K 59/124* (2023.01)
*H10K 59/126* (2023.01)
*H10K 59/131* (2023.01)
*H10K 59/35* (2023.01)
*H10K 77/10* (2023.01)
*H10K 102/00* (2023.01)

(52) U.S. Cl.
CPC ......... *H10K 59/124* (2023.02); *H10K 59/126* (2023.02); *H10K 59/131* (2023.02); *H10K 77/111* (2023.02); *H01L 27/1225* (2013.01); *H01L 27/1244* (2013.01); *H01L 27/1251* (2013.01); *H01L 27/1255* (2013.01); *H01L 29/78633* (2013.01); *H01L 29/78675* (2013.01); *H01L 29/7869* (2013.01); *H10K 59/352* (2023.02); *H10K 59/353* (2023.02); *H10K 2102/311* (2023.02); *H10K 2102/341* (2023.02)

(58) Field of Classification Search
CPC .. H10K 59/131; H10K 77/111; H10K 59/352; H10K 59/353; H10K 2102/311; H10K 2102/341; H10K 59/00; H10K 59/12; H10K 50/80; H10K 50/844; H01L 27/1225; H01L 27/1244; H01L 27/1251; H01L 27/1255; H01L 29/78633; H01L 29/78675; H01L 29/7869; H01L 27/1248; H01L 27/1214; H01L 27/124; H01L 29/66742; H01L 29/78672; Y02E 10/549; G09F 9/301
See application file for complete search history.

(56) References Cited

U.S. PATENT DOCUMENTS

| | | | |
|---|---|---|---|
| 9,293,485 B2 | 3/2016 | Youn et al. | |
| 9,318,427 B2 | 4/2016 | Youn et al. | |
| 9,349,758 B2 | 5/2016 | Ki et al. | |
| 9,356,087 B1 | 5/2016 | Lee et al. | |
| 9,543,370 B2 | 1/2017 | Tsai et al. | |
| 9,647,052 B2 | 5/2017 | Youn et al. | |
| 9,818,765 B2 | 11/2017 | Osawa et al. | |
| 9,876,064 B2 | 1/2018 | Kim et al. | |
| 10,032,841 B2 | 7/2018 | Tsai et al. | |
| 10,083,990 B2 | 9/2018 | Oh et al. | |
| 10,096,622 B2 | 10/2018 | Gupta et al. | |
| 10,109,704 B2 | 10/2018 | Shin et al. | |
| 10,115,740 B2 | 10/2018 | Hanada et al. | |
| 10,541,288 B2 | 1/2020 | Kim et al. | |
| 10,686,025 B2 | 6/2020 | Oh | |
| 10,707,237 B2 | 7/2020 | Gupta et al. | |
| 10,714,557 B2 | 7/2020 | Lee et al. | |
| 10,741,588 B2 | 8/2020 | Gupta et al. | |
| 10,824,211 B2 | 11/2020 | Hanada et al. | |
| 10,847,593 B2 | 11/2020 | Kim et al. | |
| 10,998,344 B2 | 5/2021 | Gupta et al. | |
| 11,164,928 B2 | 11/2021 | Kim et al. | |
| 11,177,291 B2 | 11/2021 | Osawa et al. | |
| RE49,052 E | 4/2022 | Youn et al. | |
| 11,442,515 B2 | 9/2022 | Hanada et al. | |
| 11,574,977 B2 | 2/2023 | Kim et al. | |
| 11,587,954 B2 | 2/2023 | Gupta et al. | |
| 2004/0027058 A1 | 2/2004 | Park | |
| 2004/0232443 A1 | 11/2004 | Cho et al. | |
| 2004/0257353 A1 | 12/2004 | Imamura et al. | |
| 2007/0069211 A1 | 3/2007 | Inoue et al. | |
| 2007/0296652 A1 | 12/2007 | Imamura et al. | |
| 2010/0182223 A1 | 7/2010 | Choi et al. | |
| 2011/0063275 A1 | 3/2011 | Imamura | |
| 2013/0134415 A1 | 5/2013 | Godo | |
| 2013/0153914 A1 | 6/2013 | You et al. | |
| 2014/0217373 A1 | 8/2014 | Youn et al. | |
| 2014/0353670 A1 | 12/2014 | Youn et al. | |
| 2015/0055051 A1 | 2/2015 | Osawa et al. | |
| 2015/0060778 A1 | 3/2015 | Kim et al. | |
| 2015/0097172 A1 | 4/2015 | Han et al. | |
| 2015/0187279 A1 | 7/2015 | Lee et al. | |
| 2015/0243722 A1 | 8/2015 | Kwon et al. | |
| 2015/0287750 A1 | 10/2015 | Youn et al. | |
| 2016/0064421 A1 | 3/2016 | Oh et al. | |
| 2016/0079336 A1 | 3/2016 | Youn et al. | |
| 2016/0087022 A1 | 3/2016 | Tsai et al. | |
| 2016/0141348 A1 | 5/2016 | Lin et al. | |
| 2016/0163745 A1 | 6/2016 | Choi et al. | |
| 2016/0218305 A1 | 7/2016 | Kim et al. | |
| 2016/0240605 A1 | 8/2016 | Lee et al. | |
| 2016/0313769 A1 | 10/2016 | Yoshitani et al. | |
| 2016/0372497 A1 | 12/2016 | Lee et al. | |
| 2017/0040406 A1 | 2/2017 | Park et al. | |
| 2017/0062539 A1 | 3/2017 | Tsai et al. | |
| 2017/0125505 A1 | 5/2017 | Oh | |
| 2017/0194405 A1 | 7/2017 | Tang | |
| 2017/0194411 A1 | 7/2017 | Park et al. | |
| 2017/0207245 A1 | 7/2017 | Hanada et al. | |
| 2017/0277288 A1 | 9/2017 | Choi et al. | |
| 2017/0288007 A1 | 10/2017 | Shin et al. | |
| 2017/0294456 A1 | 10/2017 | Lee et al. | |
| 2017/0294497 A1 | 10/2017 | Lius et al. | |
| 2017/0331073 A1 | 11/2017 | Choi et al. | |
| 2018/0033805 A1 | 2/2018 | Gupta et al. | |
| 2018/0130862 A1 | 5/2018 | Kim et al. | |
| 2018/0175127 A1 | 6/2018 | Lee et al. | |
| 2018/0182832 A1 | 6/2018 | Lee et al. | |
| 2018/0233552 A1 | 8/2018 | Lee et al. | |
| 2019/0006394 A1 | 1/2019 | Gupta et al. | |
| 2019/0041932 A1 | 2/2019 | Hanada et al. | |
| 2019/0189720 A1* | 6/2019 | Lim | H10K 59/131 |
| 2019/0189721 A1* | 6/2019 | Kim | H10K 59/124 |
| 2019/0189975 A1* | 6/2019 | Lim | H01L 29/7869 |
| 2020/0075636 A1 | 3/2020 | Gupta et al. | |
| 2020/0119116 A1 | 4/2020 | Kim et al. | |
| 2020/0203457 A1* | 6/2020 | Lim | H10K 59/126 |
| 2020/0335528 A1 | 10/2020 | Gupta et al. | |
| 2020/0395427 A1 | 12/2020 | Kim et al. | |
| 2021/0011536 A1 | 1/2021 | Hanada et al. | |
| 2021/0225890 A1 | 7/2021 | Osawa et al. | |
| 2022/0028946 A1 | 1/2022 | Kim et al. | |
| 2022/0037374 A1 | 2/2022 | Gupta et al. | |
| 2022/0367528 A1 | 11/2022 | Hanada et al. | |
| 2023/0154931 A1 | 5/2023 | Osawa et al. | |
| 2023/0354646 A1* | 11/2023 | Lim | H10K 59/123 |

FOREIGN PATENT DOCUMENTS

| | | |
|---|---|---|
| CN | 204167325 U | 2/2015 |
| CN | 104425550 A | 3/2015 |
| CN | 105144270 A | 12/2015 |
| CN | 105390504 A | 3/2016 |
| EP | 1 727 207 A2 | 11/2006 |
| EP | 3051333 A1 | 8/2016 |
| JP | 2005-004173 A | 1/2005 |
| JP | 2011-209405 A | 10/2011 |
| JP | 2016-534390 A | 11/2016 |
| JP | 2017-126693 A | 7/2017 |
| JP | 2017-536646 A | 12/2017 |
| JP | 2022-142914 A | 10/2022 |
| KR | 100556541 B1 | 3/2006 |
| KR | 10-2010-0086256 A | 7/2010 |
| KR | 10-2013-0069048 A | 6/2013 |

(56) References Cited

FOREIGN PATENT DOCUMENTS

| | | | |
|---|---|---|---|
| KR | 10-2014-0099164 A | 8/2014 |
| KR | 10-2014-0140150 A | 12/2014 |
| KR | 10-2015-0101409 A | 9/2015 |
| KR | 10-2015-0101418 A | 9/2015 |
| KR | 10-2016-0027907 A | 3/2016 |
| KR | 10-2016-0043327 A | 4/2016 |
| KR | 10-2016-0093202 A | 8/2016 |
| KR | 10-2017-0018184 A | 2/2017 |
| KR | 10-2017-0044167 A | 4/2017 |
| KR | 10-2017-0051680 A | 5/2017 |
| KR | 10-2017-0093869 A | 8/2017 |
| KR | 10-2017-0106621 A | 9/2017 |
| KR | 10-2017-0114029 A | 10/2017 |
| KR | 10-2017-0136484 A | 12/2017 |
| TW | 200506781 A | 2/2005 |
| WO | WO 2016/048385 A1 | 3/2016 |

OTHER PUBLICATIONS

China National Intellectual Property Administration, Office Action, CN Patent Application No. 201811494524.5, dated Mar. 11, 2023, 24 pages.
China National Intellectual Property Office, Office Action, CN Patent Application No. 201811494524.5, dated Oct. 10, 2022, 26 pages.
First Office Action, Japan Patent Office Application No. 2021-073985, dated Apr. 5, 2022, 8 pages.
German Patent and Trademark Office, Office Action, DE Patent Application No. 10 2018 132 095.7, dated Feb. 8, 2023, 20 pages.
German Patent and Trademark Office, Office Action, German Patent Application No. 102018130713.6, dated Jun. 30, 2023, 14 pages.
Japan Patent Office, Notice of Reasons for Rejection, JP Patent Application No. 2018-232979, dated Jun. 23, 2020, ten pages.
Japan Patent Office, Notice of Reasons for Rejection, JP Patent Application No. 2018-232979, dated Dec. 10, 2019, nine pages.
Korean Intellectual Property Administration, Office Action, KR Patent Application No. 10-2020-0140125, dated Jan. 23, 2021, 27 pages.
Korean Intellectual Property Office, Notification of Reason for Refusal, KR Patent Application No. 10-2017-0175053, dated May 20, 2019, 21 pages.
The Intellectual Property Office of the United Kingdom, Combined Search and Examination Report under Sections 17 and 18(3), GB Application No. 1820727.4, dated May 30, 2019, nine pages.
The Japan Patent Office, Notice of Allowance, Japanese Patent Application No. 2022-142914, dated Jun. 13, 2023, six pages.
United States Office Action, U.S. Appl. No. 16/206,802, dated Aug. 26, 2020, ten pages.

\* cited by examiner

DISPLAY DEVICE

CROSS-REFERENCE TO RELATED APPLICATIONS

This application is a continuation of U.S. patent application Ser. No. 17/953,571 filed on Sep. 27, 2022, which is a continuation of U.S. patent application Ser. No. 17/227,011 filed on Apr. 9, 2021, which is a continuation of U.S. patent application Ser. No. 16/206,802 filed on Nov. 30, 2018 which claims the benefit of Korean Patent Application No. 10-2017-0175053, filed on Dec. 19, 2017, each of which is hereby incorporated by reference as if fully set forth herein.

BACKGROUND

Field of Technology

The present disclosure relates to a display device, and more particularly to a display device that is capable of being driven with low power consumption.

Discussion of the Related Art

An image display device, which displays various kinds of information on a screen, is a core technology of the information and communication age, and is currently being developed with the aims of realizing a thinner and lighter design, greater portability and higher performance. Hence, flat panel display devices, which overcome the disadvantageously great weight and volume of a cathode ray tube (CRT), are in the spotlight.

Examples of flat panel display devices include liquid crystal display (LCD) devices, plasma display panel (PDP) devices, organic light-emitting display (OLED) devices, and electrophoretic display (ED) devices.

In recent years, personal electronic devices, to which the above flat panel display devices are applied, have been actively developed in the direction of becoming more portable and/or wearable. These portable or wearable devices require display devices that are capable of being driven with low power consumption. However, it is difficult to manufacture display devices capable of being driven with low power consumption using current technology.

SUMMARY

Accordingly, the present disclosure is directed to a display device that substantially obviates one or more problems due to limitations and disadvantages of the related art.

An object of the present disclosure is to provide a display device that is capable of being driven with low power consumption.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the disclosure, as embodied and broadly described herein, there is provided a display device, in which a first thin-film transistor including a polycrystalline semiconductor layer and a second thin-film transistor including an oxide semiconductor layer are disposed in an active area, thereby reducing power consumption, in which at least one opening formed in a bending area is formed to have the same depth as any one of contact holes formed in the active area, thereby making it possible to form the opening and the contact holes through the same process and consequently simplifying the process of manufacturing the device, and in which a high potential supply line and a low potential supply line overlap each other with a protective film formed of an inorganic insulation material interposed there between, thereby preventing short-circuiting of the high potential supply line and the low potential supply line.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings.

Figure 1:
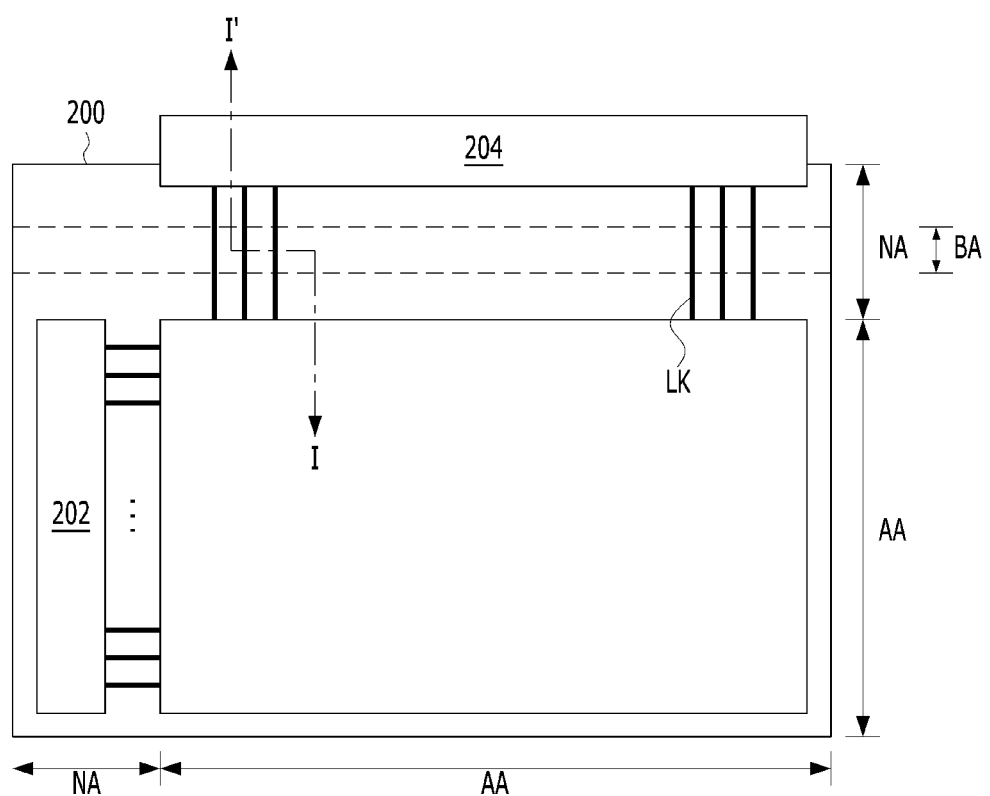
FIG. 1 is a plan view illustrating a display device according to one embodiment of the present disclosure.
Figure 2:
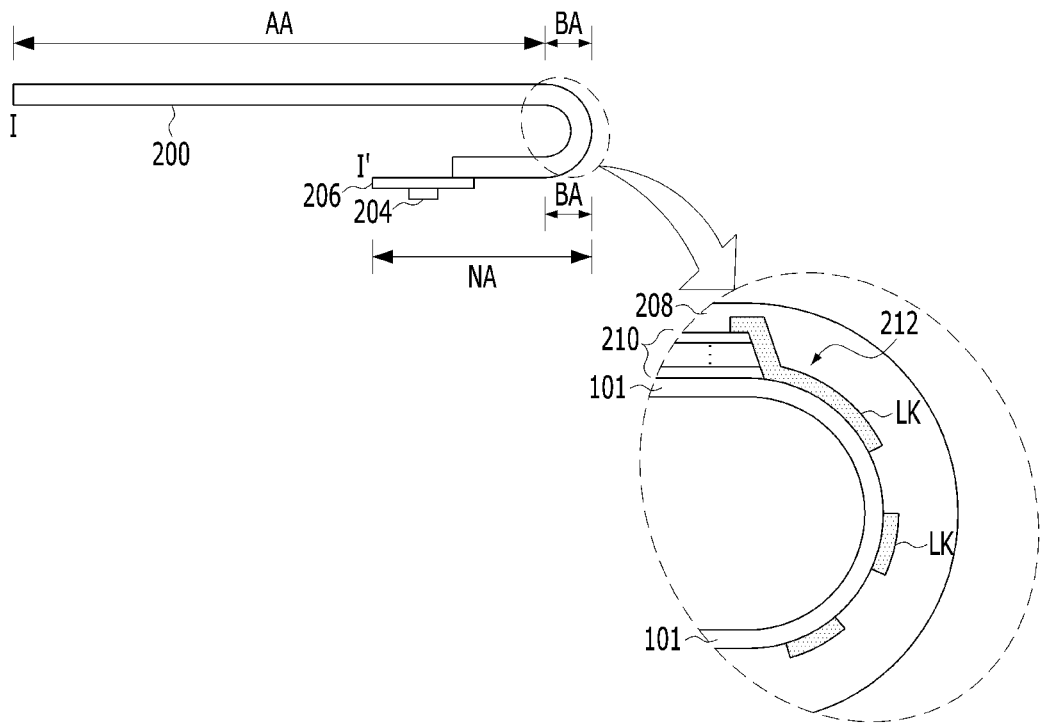
FIG. 2 is a cross-sectional view taken along line I-I' in the display device shown in FIG. 1 according to one embodiment of the present disclosure.

FIG. 1 is a plan view of a display device according to the present disclosure, and FIG. 2 is a cross-sectional view of the display device according to the present disclosure.

The display device shown in FIGS. 1 and 2 includes a display panel 200, a gate-driving unit 202, and a data-driving unit 204.

The display panel 200 is divided into an active area AA provided on a substrate 101 and a non-active area NA provided around the active area AA. The substrate 101 is formed of a plastic material having flexibility so as to be bendable. The substrate is formed of a material such as, for example, polyimide (PI), polyethylene terephthalate (PET), polyethylene naphthalate (PEN), PC (polycarbonate), polyethersulfone (PES), polyarylate (PAR), polysulfone (PSF), cyclic-olefin copolymer (COC), or the like.

Figure 3A:
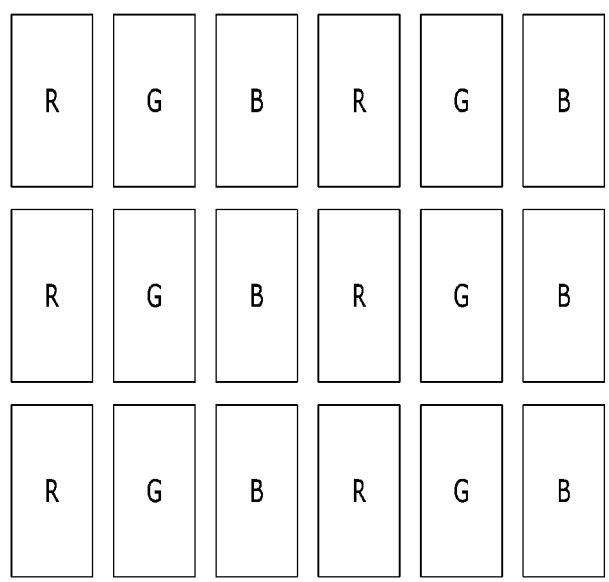
FIGS. 3A and 3B are plan views illustrating sub-pixels disposed in the active area shown in FIG. 1 according to one embodiment of the present disclosure.
Figure 3B:
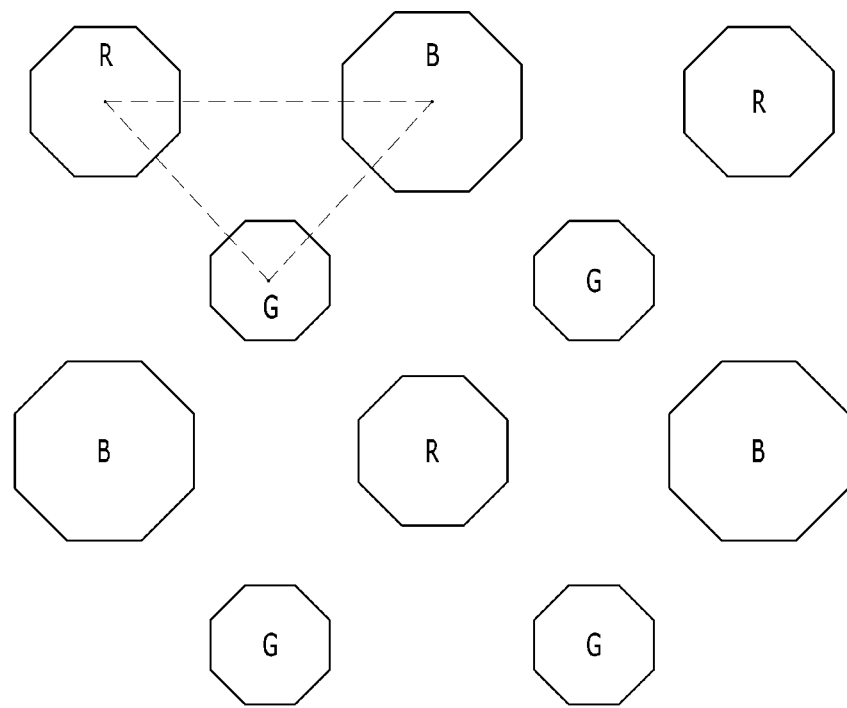

The active area AA displays an image through unit pixels arranged in a matrix form. Each of the unit pixels includes a red (R) sub-pixel, a green (G) sub-pixel, and a blue (B) sub-pixel, or includes a red (R) sub-pixel, a green (G) sub-pixel, a blue (B) sub-pixel, and a white (W) sub-pixel. For example, as shown in FIG. 3A, the red (R) sub-pixel, the green (G) sub-pixel and the blue (B) sub-pixel may be arranged in a row along the same imaginary horizontal line. Alternatively, as shown in FIG. 3B, the red (R) sub-pixel, the green (G) sub-pixel and the blue (B) sub-pixel may be spaced apart from each other so as to be arranged in the form of an imaginary triangle.

Each sub-pixel includes at least one of a thin-film transistor including an oxide semiconductor layer or a thin-film transistor including a polycrystalline semiconductor layer. A thin-film transistor including an oxide semiconductor layer and a thin-film transistor including a polycrystalline semiconductor layer have higher electron mobility than a thin-film transistor including an amorphous semiconductor layer, and are therefore capable of providing high resolution and of being driven with low power.

At least one of the data-driving unit 204 or the gate-driving unit 202 may be disposed in the non-active area NA.

The gate-driving unit 202 drives a scan line of the display panel 200. The gate-driving unit 202 is embodied using at least one of a thin-film transistor including an oxide semiconductor layer or a thin-film transistor including a polycrystalline semiconductor layer. At this time, the thin-film transistor of the gate-driving unit 202 is formed simultaneously with at least one thin-film transistor disposed in each sub-pixel in the active area AA in the same process.

Figure 4A:
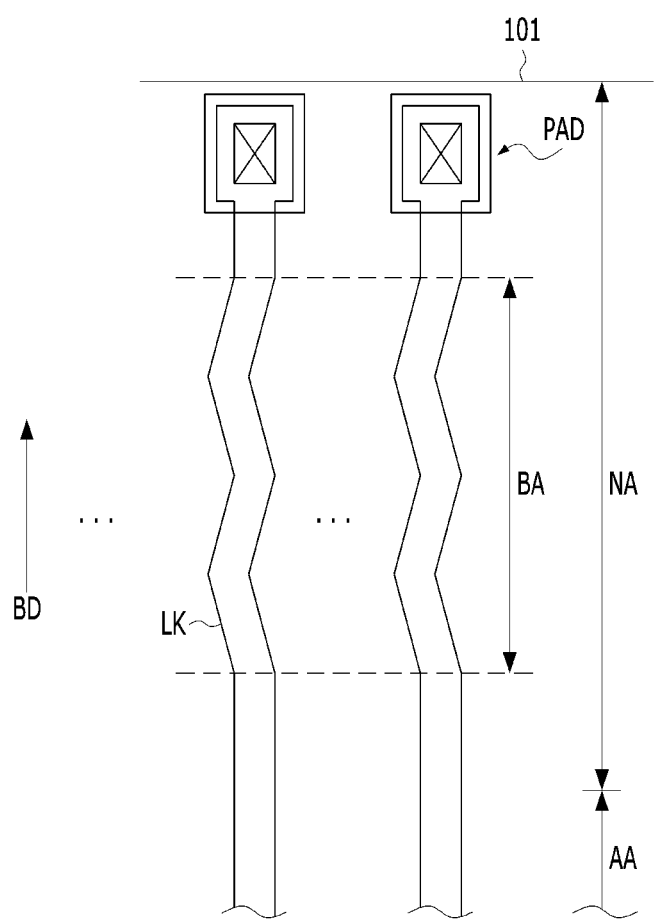
FIGS. 4A and 4B are plan views illustrating embodiments of a signal link disposed in the bending area shown in FIG. 1 according to one embodiment of the present disclosure.
Figure 4B:
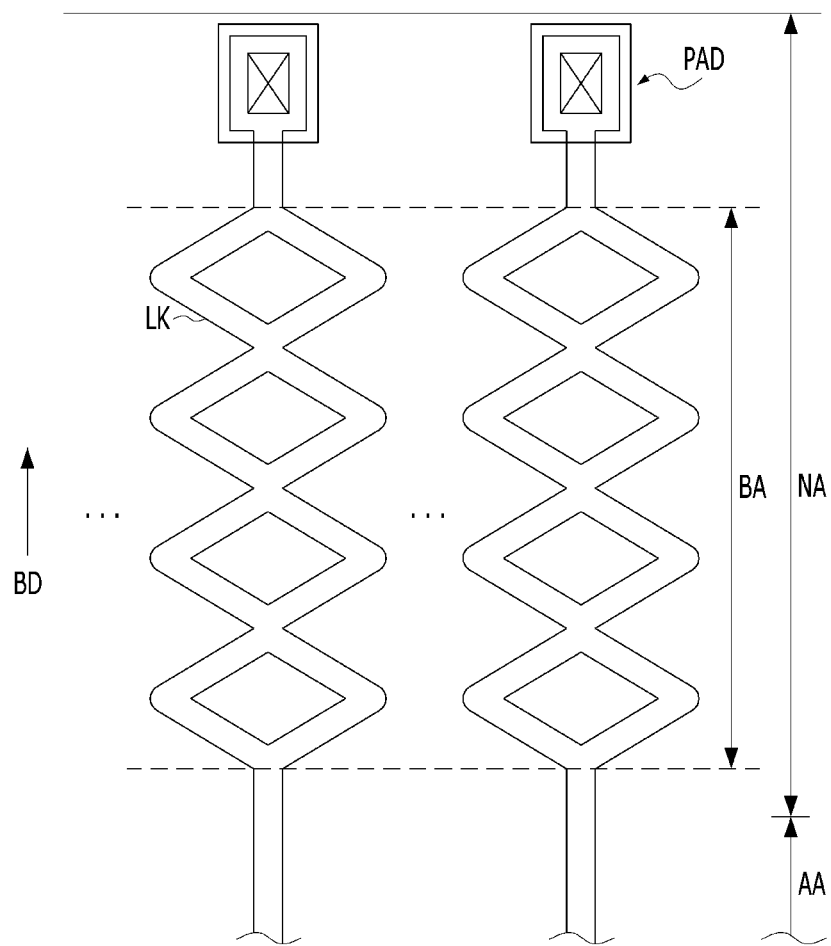

The data-driving unit 204 drives a data line of the display panel 200. The data-driving unit 204 is attached to the non-active area NA by being mounted on the substrate 101 in a chip form or by being mounted on a signal transmission film 206 in a chip form. As shown in FIGS. 4A and 4B, a plurality of signal pads PAD is disposed in the non-active area NA for electrical connection with the signal transmission film 206. Driving signals, which are generated from the data-driving unit 204, the gate-driving unit 202, a power source (not shown) and a timing controller (not shown), are supplied to a signal line disposed in the active area AA through the signal pads PAD.

The non-active area NA includes a bending area BA for bending or folding the display panel 200. The bending area BA is an area that is bent so that the components such as the signal pads PAD, the gate-driving unit 202 and the data-driving unit 204, which do not function to display, are located at the bottom surface of the active area AA. The bending area BA, as shown in FIG. 1, is located in the upper portion of the non-active area NA, which corresponds to a region between the active area AA and the data-driving unit 204. Alternatively, the bending area BA may be located in at least one of the upper portion, the lower portion, the left portion or the right portion of the non-active area NA. Accordingly, in the entire screen of the display device, the area occupied by the active area AA is maximized, and the area occupied by the non-active area NA is minimized.

A signal link LK is disposed in the bending area BA in order to connect each of the signal pads PAD with a corresponding one of the signal lines disposed in the active area AA. In the case in which the signal link LK is formed in the shape of a straight line that extends in a bending direction BD, the signal link LK may undergo the largest bending stress, and thus a crack or short-circuit may be formed in the signal link LK. In order to prevent this problem, the signal link LK of the present disclosure is formed such that the width thereof in a direction perpendicular to the bending direction BD in increased so as to minimize the bending stress that is applied thereto. To this end, as shown in FIG. 4A, the signal link LK is formed in a zigzag shape or a sine wave shape. Alternatively, as shown in FIG. 4B, the signal link LK is formed such that a plurality of diamonds, each having a hollow center portion, is arranged in a row while being connected to each other.

In addition, as shown in FIG. 2, the bending area BA has therein at least one opening 212 for facilitating bending of the bending area BA. The opening 212 is formed by eliminating a plurality of inorganic insulation layers 210 from the bending area BA, which cause cracking in the active area AA. When the substrate 101 is bent, bending stress is continuously applied to the inorganic insulation layers 210 disposed in the bending area BA. The inorganic insulation layers 210 are less elastic than an organic insulation material, and are thus vulnerable to cracking. The cracks formed in the inorganic insulation layers 210 spread to the active area AA via the inorganic insulation layers 210, leading to defects in the lines and malfunction of the elements. In order to prevent this problem, at least one planarization layer 208, which is formed of an organic insulation material that is more elastic than the inorganic insulation layers 210, is disposed in the bending area BA. The planarization layer 208 functions to mitigate bending stress that occurs when the substrate 101 is bent, thereby preventing the occurrence of cracks. The opening 212 formed in the bending area BA is formed through the same mask process as at least one of a plurality of contact holes formed in the active area AA, whereby the structure and the manufacturing process of the display device are simplified.

This display device, which can be simplified in structure and manufacturing process, is applicable to a display device that requires a thin-film transistor, such as a liquid crystal display device, an organic light-emitting display device, or the like. Hereinafter, a description of the embodiment of the present disclosure will be made. The following description is given on the assumption that the above-described display device, which can be simplified in structure and manufacturing process, is an organic light-emitting display device, by way of example.

Figure 5A:
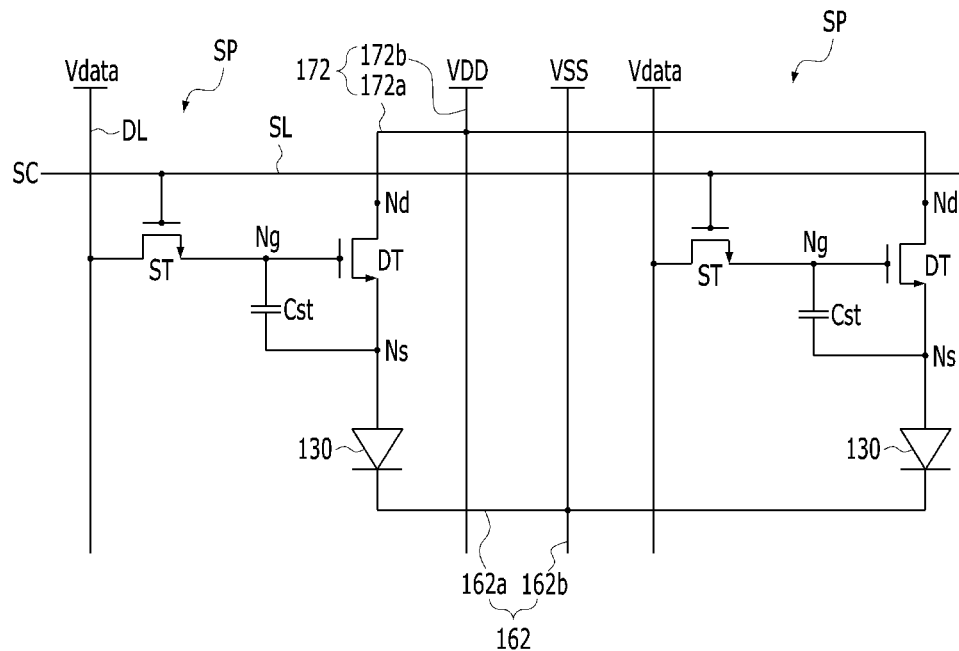
FIGS. 5A and 5B are circuit diagrams for explaining each sub-pixel of the display device shown in FIG. 1 according to one embodiment of the present disclosure.
Figure 5B:
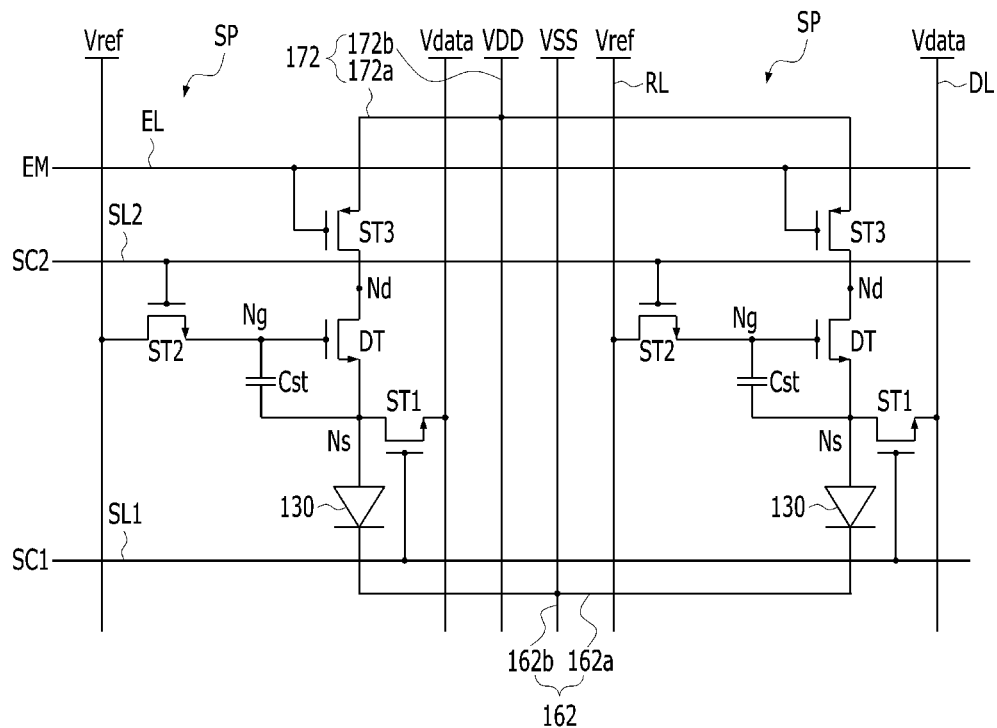

As shown in FIGS. 5A and 5B, in the organic light-emitting display device, each of the sub-pixels SP includes a pixel-driving circuit and a light-emitting element 130, which is connected with the pixel-driving circuit.

Figure 6:
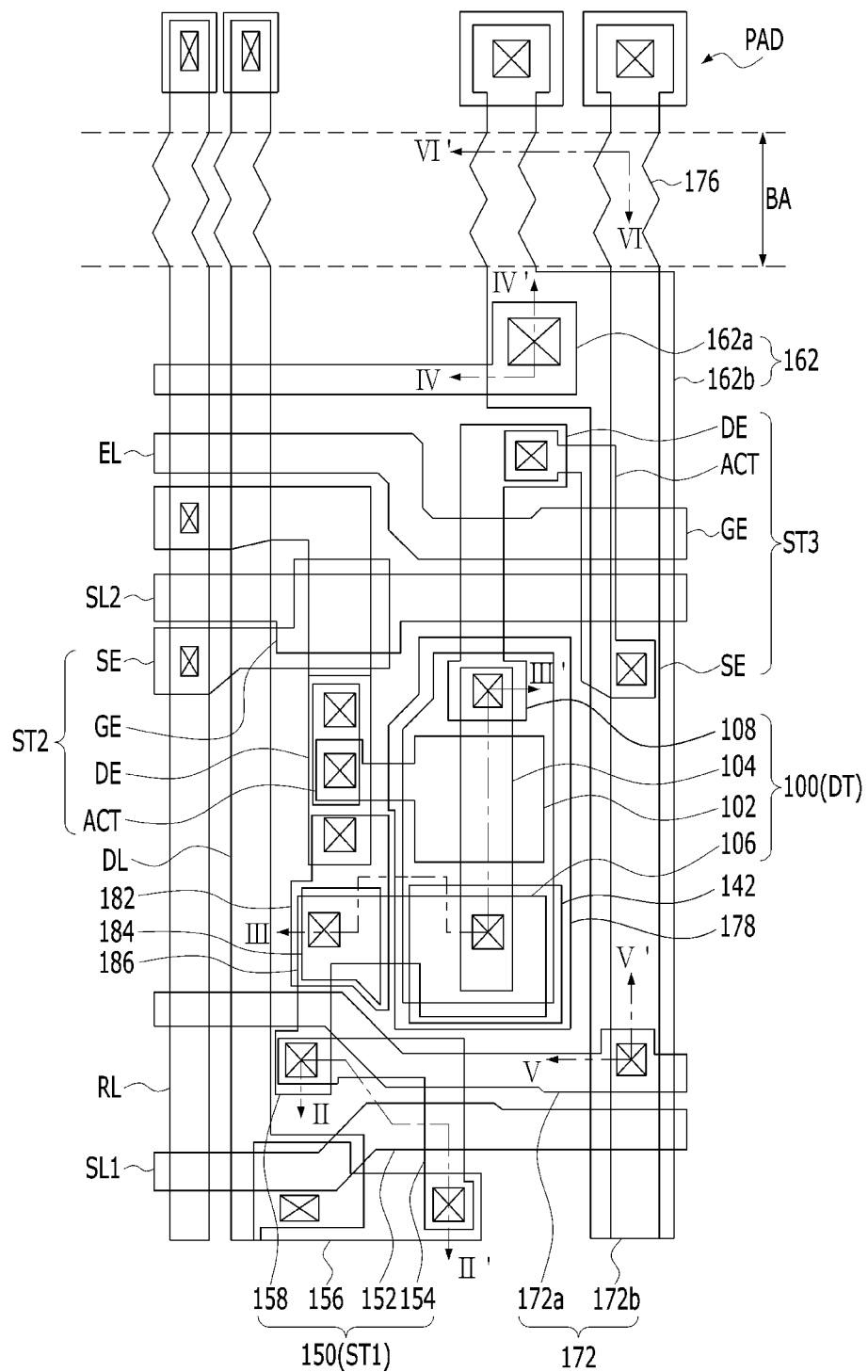
FIG. 6 is a plan view illustrating the sub-pixel shown in FIG. 5B according to one embodiment of the present disclosure.

As shown in FIG. 5A, the pixel-driving circuit has a 2T1C structure that includes two thin-film transistors ST and DT and one storage capacitor Cst. Alternatively, as shown in FIGS. 5B and 6, the pixel-driving circuit has a 4T1C structure that includes four thin-film transistors ST1, ST2, ST3 and DT and one storage capacitor Cst. However, the structure of the pixel-driving circuit is not limited to the aforementioned structures shown in FIGS. 5A and 5B, but the pixel-driving circuit may have various other structures.

In the pixel-driving circuit shown in FIG. 5A, the storage capacitor Cst connects a gate node Ng and a source node Ns to maintain a substantially constant voltage between the gate node Ng and the source node Ns during the light-emitting operation. There is provided a driving transistor DT, which includes a gate electrode, which is connected to the gate node Ng, a drain electrode, which is connected to the drain node Nd, and a source electrode, which is connected to the light-emitting element 130. The driving transistor DT controls the magnitude of the driving current in response to the voltage between the gate node Ng and the source node Ns. There is further provided a switching transistor ST, which includes a gate electrode, which is connected to a scan line SL, a drain electrode, which is connected to a data line DL, and a source electrode, which is connected to the gate node Ng. The switching transistor ST is turned on in response to a scan control signal SC from the scan line SL, and supplies data voltage Vdata from the data line DL to the gate node Ng. The light-emitting element 130 connects the source node Ns, which is connected to the source electrode of the driving transistor DT, to a low potential supply line 162 to emit light in response to the driving current.

The pixel-driving circuit shown in FIG. 5B has substantially the same construction as the pixel-driving circuit shown in FIG. 5A, except that a source electrode of a first switching transistor ST1 connected with the data line DL is connected to the source node Ns and that second and third switching transistors ST2 and ST3 are further provided. A duplicate explanation of the same components will be omitted.

The first switching transistor ST1 shown in FIGS. 5B and 6 includes a gate electrode 152, which is connected to a first scan line SL1, a drain electrode 158, which is connected to the data line DL, a source electrode 156, which is connected to the source node Ns, and a semiconductor layer 154, which forms a channel between the source electrode 156 and the drain electrode 158. The first switching transistor ST1 is turned on in response to a scan control signal SC1 from the first scan line SL1, and supplies data voltage Vdata from the data line DL to the source node Ns.

The second switching transistor ST2 includes a gate electrode GE, which is connected to a second scan line SL2, a drain electrode DE, which is connected to a reference line RL, a source electrode SE, which is connected to the gate node Ng, and a semiconductor layer ACT, which forms a channel between the source electrode SE and the drain electrode DE. The second switching transistor ST2 is turned on in response to a scan control signal SC2 from the second scan line SL2, and supplies a reference voltage Vref from the reference line RL to the gate node Ng.

The third switching transistor ST3 includes a gate electrode GE, which is connected to a light emission control line EL, a drain electrode DE, which is connected to a high potential supply line 172, a source electrode SE, which is connected to the drain node Nd, and a semiconductor layer ACT, which forms a channel between the source electrode SE and the drain electrode DE. The third switching transistor ST3 is turned on in response to a light emission control signal EN from the light emission control line EL, and supplies a high potential voltage VDD from the high potential supply line 172 to the drain node Nd.

Each of the high potential supply line 172 and the low potential supply line 162, which are included in the pixel-driving circuit, is formed in a mesh shape so that at least two sub-pixels share the same. To this end, the high potential supply line 172 includes a first high potential supply line 172a and a second high potential supply line 172b, which intersect each other, and the low potential supply line 162 includes a first low potential supply line 162a and a second low potential supply line 162b, which intersect each other.

The second high potential supply line 172b and the second low potential supply line 162b are arranged parallel to the data line DL. One second high potential supply line 172b is provided for at least two sub-pixels. One second low potential supply line 162b is provided for at least two sub-pixels. As shown in FIGS. 5A and 5B, the second high potential supply line 172b and the second low potential supply line 162b are arranged parallel to each other in the lateral direction. Alternatively, as shown in FIG. 6, the second high potential supply line 172b and the second low potential supply line 162b are arranged parallel to each other in the vertical direction so as to overlap each other.

The first high potential supply line 172a is electrically connected to the second high potential supply line 172b, and is arranged parallel to the scan line SL. The first high potential supply line 172a diverges from the second high potential supply line 172b. The first high potential supply line 172a compensates for the resistance of the second high potential supply line 172b, whereby the voltage drop (IR drop) of the high potential supply line 172 is minimized.

The first low potential supply line 162a is electrically connected to the second low potential supply line 162b, and is arranged parallel to the scan line SL. The first low potential supply line 162a diverges from the second low potential supply line 162b. The first low potential supply line 162a compensates for the resistance of the second low potential supply line 162b, whereby the voltage drop (IR drop) of the low potential supply line 162 is minimized.

As such, each of the high potential supply line 172 and the low potential supply line 162 is formed in a mesh shape. Therefore, the number of second high potential supply lines 172b and second low potential supply lines 162b, which are arranged in the vertical direction, may be reduced, and a larger number of sub-pixels may be disposed due to the reduced number of second high potential supply lines 172b and second low potential supply lines 162b, whereby the aperture ratio and the resolution of the device are increased.

Figure 7A:
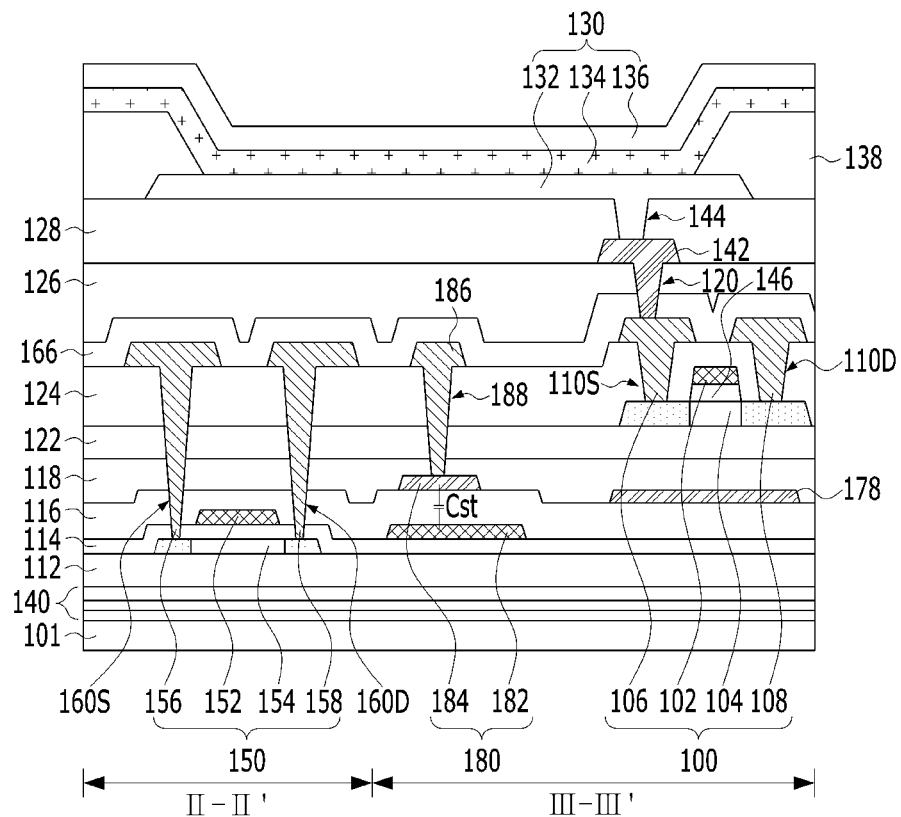
FIG. 7A is a cross-sectional view taken along lines II-II', III-III
Figure 7B:
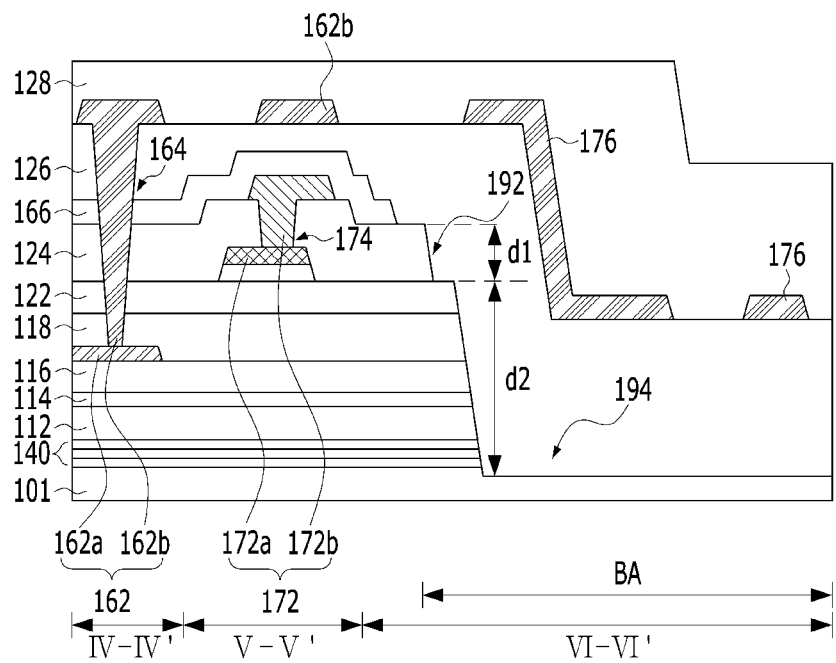
' and FIG. 7B is a cross-sectional view taken along lines IV-IV', V-V' and VI-VI' in the organic light-emitting display device shown in FIG. 6 according to one embodiment of the present disclosure.

One of the transistors included in the pixel-driving circuit includes a polycrystalline semiconductor layer, and the remaining one includes an oxide semiconductor layer. As shown in FIGS. 7A and 7B, the switching transistor ST of the pixel-driving circuit shown in FIG. 5A is embodied by a first thin-film transistor 150 including a polycrystalline semiconductor layer 154, and the driving transistor DT is embodied by a second thin-film transistor 100 including an oxide semiconductor layer 104. Each of the first switching transistor ST1 and the third switching transistor ST3 of the pixel-driving circuits shown in FIGS. 5B and 6 is embodied by a first thin-film transistor 150 including a polycrystalline semiconductor layer 154, and each of the second switching transistor ST2 and the driving transistor DT is embodied by a second thin-film transistor 100 including an oxide semiconductor layer 104. As such, according to the present disclosure, the second thin-film transistor 100 including the oxide semiconductor layer 104 is applied to the driving transistor DT of each sub-pixel, and the first thin-film transistor 150 including the polycrystalline semiconductor layer 154 is applied to the switching transistor ST of each sub-pixel, whereby power consumption is reduced.

The first thin-film transistor 150 shown in FIGS. 6, 7A, and 7B includes the polycrystalline semiconductor layer 154, the first gate electrode 152, the first source electrode 156, and the first drain electrode 158.

The polycrystalline semiconductor layer 154 is formed on a lower buffer layer 112. The polycrystalline semiconductor layer 154 includes a channel region, a source region, and a drain region. The channel region overlaps the first gate electrode 152 with a lower gate insulation film 114 interposed there between, and is formed between the first source electrode 156 and the first drain electrode 158. The source region is electrically connected to the first source electrode 156 through a first source contact hole 160S. The drain region is electrically connected to the first drain electrode 158 through a first drain contact hole 160D. The polycrystalline semiconductor layer 154 has higher mobility than the amorphous semiconductor layer and the oxide semiconductor layer 104, thereby exhibiting low energy/power consumption and improved reliability. Therefore, the polycrystalline semiconductor layer 154 is suitable for application to the switching transistor ST of each sub-pixel and the gate-driving unit 202 for driving the scan line SL. A multi-buffer layer 140 and the lower buffer layer 112 are disposed between the polycrystalline semiconductor layer 154 and the substrate 101. The multi-buffer layer 140 impedes the diffusion of moisture and/or oxygen that has permeated the substrate 101. The multi-buffer layer 140 is formed in a manner such that silicon nitride (SiNx) and silicon oxide (SiOx) are alternately stacked one on anther at least once. The lower buffer layer 112 functions to protect the polycrystalline semiconductor layer 154 by interrupting the spread of various kinds of defects from the substrate 101. The lower buffer layer 112 may be formed of a-Si, silicon nitride (SiNx), silicon oxide (SiOx), or the like.

The first gate electrode 152 is formed on the lower gate insulation film 114. The first gate electrode 152 overlaps the channel region of the polycrystalline semiconductor layer 154, with the lower gate insulation film 114 interposed there between. The first gate electrode 152 may be a single layer or multiple layers formed of the same material as a lower storage electrode 182, for example, any one selected from the group consisting of molybdenum (Mo), aluminum (Al), chrome (Cr), gold (Au), titanium (Ti), nickel (Ni), neodymium (Nd), and copper (Cu), or an alloy thereof. However, the invention is not limited thereto.

First and second lower interlayer insulation films 116 and 118, which are located on the polycrystalline semiconductor layer 154, are configured as inorganic films that have higher hydrogen particle content than an upper interlayer insulation film 124. For example, the first and second lower interlayer insulation films 116 and 118 are formed of silicon nitride (SiNx) through a deposition process using ammonia (NH3) gas, and the upper interlayer insulation film 124 is formed of silicon oxide (SiOx). The hydrogen particles contained in the first and second lower interlayer insulation films 116 and 118 diffuse into the polycrystalline semiconductor layer 154 during a hydrogenation process, thereby allowing pores in the polycrystalline semiconductor layer 154 to be filled with hydrogen. Accordingly, the polycrystalline semiconductor layer 154 is stabilized, thus preventing deterioration of the properties of the first thin-film transistor 150.

The first source electrode 156 is connected to the source region of the polycrystalline semiconductor layer 154 through a first source contact hole 160S that penetrates the lower gate insulation film 114, the first and second lower interlayer insulation films 116 and 118, an upper buffer layer 122, and the upper interlayer insulation film 124. The first drain electrode 158 faces the first source electrode 156 and is connected to the drain region of the polycrystalline semiconductor layer 154 through a first drain contact hole 160D that penetrates the lower gate insulation film 114, the first and second lower interlayer insulation films 116 and 118, the upper buffer layer 122, and the upper interlayer insulation film 124. Since the first source electrode 156 and the first drain electrode 158 are positioned in the same plane and are formed of the same material as a storage supply line 186, the first source electrode 156, the first drain electrode 158 and the storage supply line 186 may be formed at the same time through the same mask process.

After the activation and hydrogenation processes of the polycrystalline semiconductor layer 154 of the first thin-film transistor 150, the oxide semiconductor layer 104 of the second thin-film transistor 100 is formed. That is, the oxide semiconductor layer 104 is disposed on the polycrystalline semiconductor layer 154. Accordingly, the oxide semiconductor layer 104 is not exposed to the high-temperature atmosphere of the activation and hydrogenation processes of the polycrystalline semiconductor layer 154, thereby preventing damage to the oxide semiconductor layer 104 and therefore improving reliability.

The second thin-film transistor 100 is disposed on the upper buffer layer 122 so as to be spaced apart from the first thin-film transistor 150. The second thin-film transistor 100 includes a second gate electrode 102, the oxide semiconductor layer 104, a second source electrode 106, and a second drain electrode 108.

The second gate electrode 102 overlaps the oxide semiconductor layer 104 with an upper gate insulation pattern 146 interposed there between. The second gate electrode 102 is formed in the same plane as the first high potential supply line 172a, that is, is formed on the upper gate insulation pattern 146 using the same material as the first high potential supply line 172a. Accordingly, the second gate electrode 102 and the first high potential supply line 172a may be formed through the same mask process, and therefore the number of mask processes may be reduced.

The oxide semiconductor layer 104 is formed on the upper buffer layer 122 so as to overlap the second gate electrode 102, thereby forming a channel between the second source electrode 106 and the second drain electrode 108. The oxide semiconductor layer 104 is formed of oxide including at least one metal selected from the group consisting of Zn, Cd, Ga, In, Sn, Hf, and Zr. Since the second thin-film transistor 100 including this oxide semiconductor layer 104 has higher electron mobility and lower off-current than the first thin-film transistor 150 including the polycrystalline semiconductor layer 154, it is suitable for application to the switching and driving thin-film transistors ST and DT, in which an On-time period is short but an Off-time period is long.

The upper interlayer insulation film 124 and the upper buffer layer 122, which are disposed adjacent to the upper side and the lower side of the oxide semiconductor layer 104, are configured as inorganic films that have lower hydrogen particle content than the lower interlayer insulation films 116 and 118. For example, the upper interlayer insulation film 124 and the upper buffer layer 122 are formed of silicon oxide (SiOx), and the lower interlayer insulation films 116 and 118 are formed of silicon nitride (SiNx). Accordingly, it is possible to prevent hydrogen contained in the lower interlayer insulation films 116 and 118 and hydrogen contained in the polycrystalline semiconductor layer 154 from being diffused to the oxide semiconductor layer 104 during a heat treatment process performed on the oxide semiconductor layer 104.

Each of the second source electrode 106 and the second drain electrode 108 may be a single layer or multiple layers formed on the upper interlayer insulation film 124, and may be formed of any one selected from the group consisting of molybdenum (Mo), aluminum (Al), chrome (Cr), gold (Au), titanium (Ti), nickel (Ni), neodymium (Nd), and copper (Cu), or an alloy thereof. However, the invention is not limited thereto.

The second source electrode 106 is connected to the source region of the oxide semiconductor layer 104 through a second source contact hole 110S that penetrates the upper interlayer insulation film 124. The second drain electrode 108 is connected to the drain region of the oxide semiconductor layer 104 through a second drain contact hole 110D that penetrates the upper interlayer insulation film 124. The second source electrode 106 and the second drain electrode 108 are formed so as to face each other with the channel region of the oxide semiconductor layer 104 interposed there between.

As shown in FIG. 7, the storage capacitor Cst (180) is formed in a manner such that a lower storage electrode 182 and an upper storage electrode 184 overlap each other with the first lower interlayer insulation film 116 interposed there between.

The lower storage electrode 182 is connected with any one of the second gate electrode 102 of the driving transistor DT and the second source electrode 106 of the driving transistor DT. The lower storage electrode 182 is located on the lower gate insulation film 114, and is formed in the same plane and is formed of the same material as the first gate electrode 152.

The upper storage electrode 184 is connected with any one of the second gate electrode 102 of the driving transistor DT and the second source electrode 106 of the driving transistor DT through the storage supply line 186. The upper storage electrode 184 is located on the first lower interlayer insulation film 116. The upper storage electrode 184 is formed in the same plane and is formed of the same material as a light-shielding layer 178 and the first low potential supply line 162a. The upper storage electrode 184 is connected with the storage supply line 186 by being exposed through a storage contact hole 188 that penetrates the second lower interlayer insulation film 118, the upper buffer layer 122 and the upper interlayer insulation film 124. Although it is illustrated in FIG. 7 that the upper storage electrode 184 is spaced apart from the light-shielding layer 178, the upper storage electrode 184 and the light-shielding layer 178 may be connected to each other in an integral form.

The first lower interlayer insulation film 116, which is disposed between the lower storage electrode 182 and the upper storage electrode 184, is formed of an inorganic insulation material such as SiOx or SiNx. The first lower interlayer insulation film 116 may be formed of SiNx, which has a higher dielectric constant than SiOx. Accordingly, the lower storage electrode 182 and the upper storage electrode 184 overlap each other with the first lower interlayer insulation film 116, formed of SiNx having a relatively high dielectric constant, interposed there between. As a result, the capacitance of the storage capacitor Cst, which is proportional to a dielectric constant, is increased.

The light-emitting element 130 includes an anode 132, which is connected to the second source electrode 106 of the second thin-film transistor 100, at least one light-emitting stack 134, which is formed on the anode 132, and a cathode 136, which is formed on the light-emitting stack 134.

The anode 132 is connected to the pixel connection electrode 142, which is exposed through a second pixel contact hole 144 that penetrates a planarization layer 128. The pixel connection electrode 142 is connected to the second source electrode 106, which is exposed through a first pixel contact hole 120 that penetrates the protective film 166 and a first planarization layer 126.

The anode 132 is formed in a multi-layer structure including a transparent conductive film and an opaque conductive film having high reflection efficiency. The transparent conductive film is formed of a material having a relatively high work function, e.g. indium-tin-oxide (ITO) or indium-zinc-oxide (IZO), and the opaque conductive film is formed in a single-layer or multi-layer structure including any one selected from the group consisting of Al, Ag, Cu, Pb, Mo, and Ti, or an alloy thereof. For example, the anode 132 may be formed in a structure such that a transparent conductive film, an opaque conductive film and a transparent conductive film are sequentially stacked, or such that a transparent conductive film and an opaque conductive film are sequentially stacked. The anode 132 is disposed on the second planarization layer 128 so as to overlap the light emission region provided by a bank 138 as well as the circuit region in which the first and second transistors 150 and 100 and the storage capacitor Cst (180) are disposed, whereby the light emission area is increased.

The light-emitting stack 134 is formed by stacking, on the anode 132, a hole-related layer, an organic emission layer, and an electron-related layer, either in that order or in the reverse order. In addition, the light-emitting stack 134 may include first and second light-emitting stacks, which face each other with a charge generation layer interposed there between. In this case, an organic emission layer of any one of the first and second light-emitting stacks generates blue light, and an organic emission layer of the remaining one of the first and second light-emitting stacks generates yellow-green light, with the result that white light is generated via the first and second light-emitting stacks. Since the white light generated from the light-emitting stack 134 is introduced into a color filter (not shown) disposed on the light-emitting stack 134, a color image may be realized. Alternatively, it may be possible to realize a color image in a manner such that each light-emitting stack 134 generates colored light corresponding to each sub-pixel without a separate color filter. That is, a light-emitting stack 134 of a red (R) sub-pixel may generate red light, a light-emitting stack 134 of a green (G) sub-pixel may generate green light, and a light-emitting stack 134 of a blue (B) sub-pixel may generate blue light.

The bank 138 may be formed so as to expose the anode 132. The bank 138 may be formed of an opaque material (e.g. a black material) in order to prevent optical interference between neighboring sub-pixels. In this case, the bank 138 includes a light-shielding material formed of at least one selected from among a color pigment, organic black and carbon materials.

The cathode 136 is formed on the top surface and the side surfaces of the light-emitting stack 134 so as to face the anode 132 with the light-emitting stack 134 interposed there between. In the case in which the cathode 136 is applied to a top-emission-type organic light-emitting display device, the cathode 136 is a transparent conductive film formed of, for example, indium-tin-oxide (ITO) or indium-zinc-oxide (IZO).

The cathode 136 is electrically connected with the low potential supply line 162. As shown in FIGS. 5B and 6, the low potential supply line 162 includes the first and second low potential supply lines 162a and 162b, which intersect each other. As shown in FIG. 7, the first low potential supply line 162a is formed in the same plane as the upper storage electrode 184, that is, is formed on the first lower interlayer insulation film 116 using the same material as the upper storage electrode 184. The second low potential supply line 162b is formed in the same plane as the pixel connection electrode 142, that is, is formed on the first planarization layer 126 using the same material as the pixel connection electrode 142. The second low potential supply line 162b is electrically connected to the first low potential supply line 162a, which is exposed through a first line contact hole 164 that penetrates the second lower interlayer insulation film 118, the upper buffer layer 122, the upper interlayer insulation film 124, the protective film 166 and the first planarization layer 126.

As shown in FIGS. 5B and 6, the high potential supply line 172, which supplies high potential voltage VDD that is higher than the low potential voltage VSS supplied through the low potential supply line 162, includes the first and second high potential supply lines 172a and 172b, which intersect each other. The first high potential supply line 172a, as shown in FIG. 7, is formed in the same plane as the second gate electrode 102, that is, is formed on the upper gate insulation pattern 146 using the same material as the second gate electrode 102. The second high potential supply line 172b is formed in the same plane as the second source and drain electrodes 106 and 108, that is, is formed on the upper interlayer insulation film 124 using the same material as the second source and drain electrodes 106 and 108. The second high potential supply line 172b is electrically connected with the first high potential supply line 172a, which is exposed through a second line contact hole 174 that penetrates the upper interlayer insulation film 124.

Since the high potential supply line 172 and the low potential supply line 162 are formed in a mesh shape, the second high potential supply line 172b and the second low potential supply line 162b, which are arranged in the vertical direction, overlap each other with the protective film 166 and the first planarization layer 126 interposed therebetween. In this case, the protective film 166 is disposed under or on the first planarization layer 126 so as to be brought into contact with the first planarization layer 126, thereby preventing short-circuiting of the second high potential supply line 172b and the second low potential supply line 162b, which may occur through a pinhole formed in the first planarization layer 126. A description thereof will now be made with reference to FIGS. 8A and 8B.

Figure 8A:
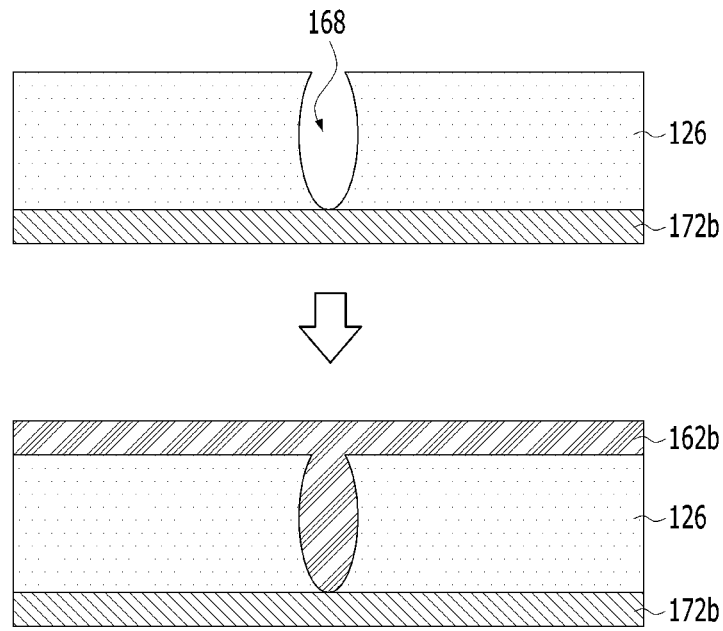
FIG. 8A is a cross-sectional view illustrating a comparative example, which does not include the protective film shown in FIGS. 7A and 7B according to one embodiment of the present disclosure.

As shown in FIG. 8A, a pinhole 168 is formed in the first planarization layer 126 due to a fine bubble that is generated when the first planarization layer 126 is applied on the second high potential supply line 172b. When the second low potential supply line 162b is formed on the first planarization layer 126 having therein the pinhole 168, the second low potential supply line 162b is also introduced into the pinhole 168, whereby short-circuiting of the second low potential supply line 162b and the second high potential supply line 172b occurs, leading to deterioration in reliability, for example, burning of the product.

Figure 8B:
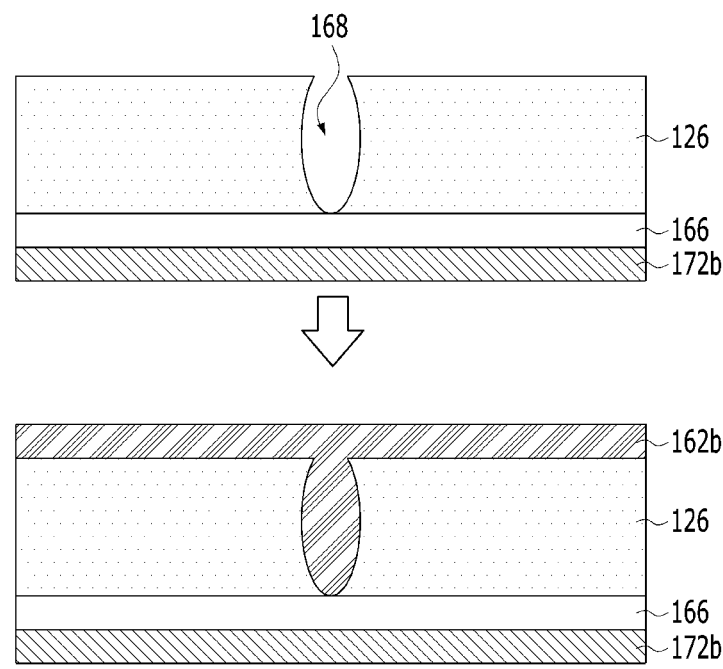
FIG. 8B is a cross-sectional view illustrating an embodiment including the protective film shown in FIGS. 7A and 7B according to one embodiment of the present disclosure.

In contrast, as shown in FIG. 8B, the protective film 166 formed of an inorganic insulation material is formed on the second high potential supply line 172b. When the first planarization layer 126 is applied on the protective film 166, the pinhole 168 is formed in the first planarization layer 126 due to a fine bubble that is generated during the application of the first planarization layer 126. When the second low potential supply line 162b is formed on the first planarization layer 126 having therein the pinhole 168, the second low potential supply line 162b is also introduced into the pinhole 168. Even when the pinhole 168 is filled with the second low potential supply line 162b, the second low potential supply line 162b and the second high potential supply line 172b are insulated from each other by the protective film 166. As described above, the protective film 166, which is disposed between the second low potential supply line 162b and the second high potential supply line 172b, is capable of preventing short-circuiting of the second low potential supply line 162b and the second high potential supply line 172b.

As shown in FIG. 7, a signal link 176, which is connected to at least one of the low potential supply line 162, the high potential supply line 172, the data line DL, the scan line SL or the light emission control line EL, is disposed across the bending area BA, in which first and second openings 192 and 194 are formed. The first opening 192 exposes the side surface of the upper interlayer insulation film 124 and the top surface of the upper buffer layer 122. The first opening 192 is formed so as to have a depth d1 equal to the depth of at least one of the second source contact hole 110S or the second drain contact hole 110D. The second opening 194 exposes the side surface of each of the multi-buffer layer 140, the lower buffer layer 112, the lower gate insulation film 114, the first and second lower interlayer insulation films 116 and 118 and the upper buffer layer 122. The second opening 194 is formed so as to have a depth d2 greater than or equal to the depth of at least one of the first source contact hole 160S or the first drain contact hole 160D. Accordingly, the multi-buffer layer 140, the lower buffer layer 112, the lower gate insulation film 114, the first and second lower interlayer insulation films 116 and 118, the upper buffer layer 122 and the upper interlayer insulation film 124 are eliminated from the bending area BA through the first and second openings 192 and 194. As a result of elimination of a plurality of inorganic insulation layers 140, 112, 114, 116, 118, 122 and 124, which cause cracks, from the bending area BA, it is possible to easily bend the substrate 101 without forming cracks.

The signal link 176, which is disposed in the bending area BA, as shown in FIG. 7, may be formed together with the pixel connection electrode 142 through the same mask process. In this case, the signal link 176 is formed in the same plane as the pixel connection electrode 142 using the same material, that is, is formed on the first planarization layer 126 and the substrate 101. In order to cover the signal link 176 formed on the first planarization layer 126 and the substrate 101, the second planarization layer 128 is disposed on the signal link 176. Alternatively, instead of the second planarization layer 128, an encapsulation film or an inorganic encapsulation layer of an encapsulation stack, which is embodied by a combination of inorganic and organic encapsulation layers, is disposed on the signal link 176.

Figure 9A:
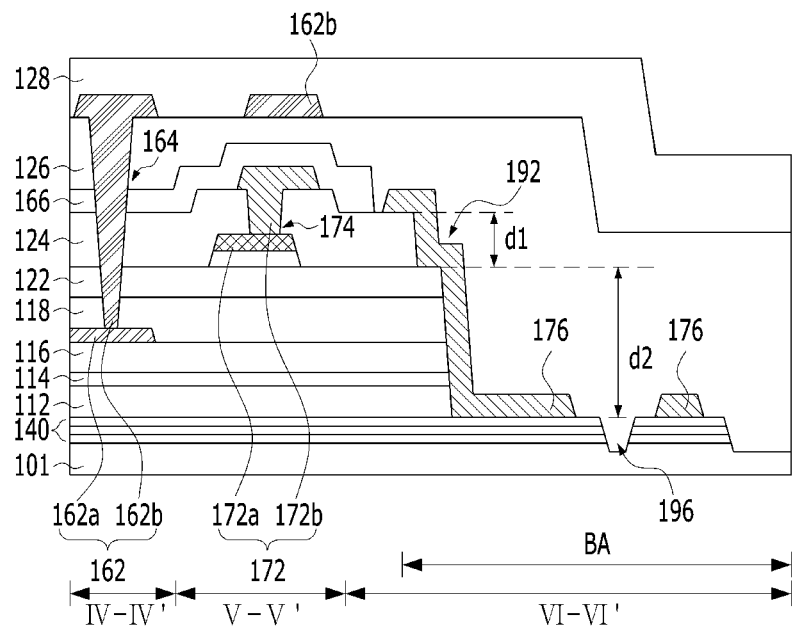
FIGS. 9A and 9B are cross-sectional views illustrating other embodiments of the bending area shown in FIGS. 7A and 7B according to one embodiment of the present disclosure.
Figure 9B:
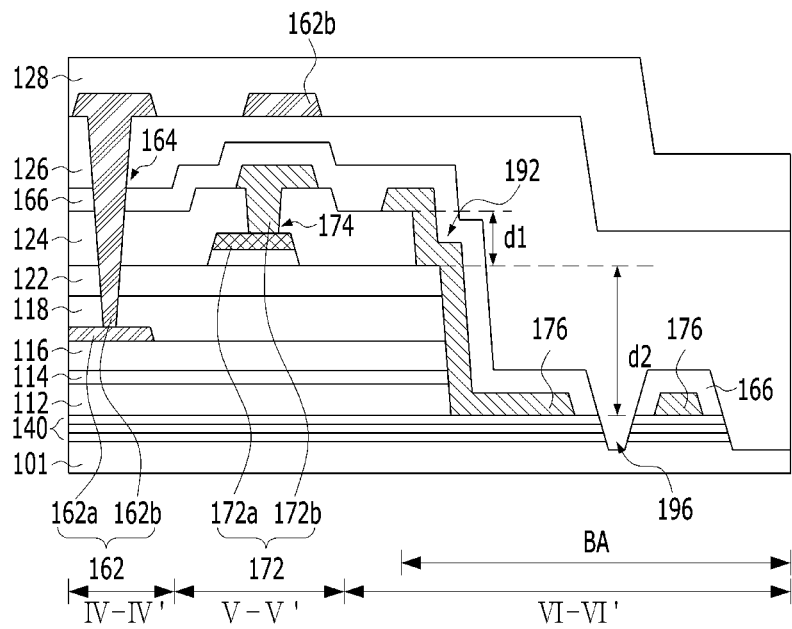

As shown in FIGS. 9A and 9B, the signal link 176 may be formed together with the source and drain electrodes 106, 156, 108 and 158 through the same mask process. In this case, the signal link 176 is formed in the same plane as the source and drain electrode 106, 156, 108 and 158 using the same material, that is, is formed on the upper interlayer insulation film 124, and is also formed on the substrate 101 so as to be brought into contact with the substrate 101. At this time, the signal link 176 is formed on the side surface of the upper interlayer insulation film 124 and the top surface of the upper buffer layer 122, which are exposed by the first opening 192, and is also formed on the side surfaces of the multi-buffer layer 140, the lower buffer layer 112, the lower gate insulation film 114, the first and second lower interlayer insulation films 116 and 118 and the upper buffer layer 122, which are exposed by the second opening 194. Therefore, the signal link 176 is formed in a step shape. In order to cover the signal link 176 formed in a step shape, at least one of the first planarization layer 126 or the second planarization layer 128 is disposed on the signal link 176. Alternatively, instead of the first and second planarization layers 126 and 128, an encapsulation film or an inorganic encapsulation layer of an encapsulation stack, which is embodied by a combination of inorganic and organic encapsulation layers, is disposed on the signal link 176.

As shown in FIGS. 9A and 9B, the signal link 176 may be disposed on the multi-buffer layer 140. At this time, a portion of the multi-buffer layer 140, which is located between the signal links 176, is eliminated so as to facilitate bending without forming cracks, with the result that a trench 196, through which the substrate 101 is exposed, is formed between the signal links 176.

The trench 196 shown in FIG. 9A is formed so as to pass throughout a portion of the multi-buffer layer 140 and to extend to a predetermined depth in a portion of the substrate 101 at a location between the signal links 176. The second planarization layer 128 is disposed on the signal links 176. The trench 196 shown in FIG. 9B is formed so as to pass throughout a portion of the protective film 166 and a portion of the multi-buffer layer 140 and to extend to a predetermined depth in a portion of the substrate 101 at a location between the signal links 176. The protective film 166 and the first and second planarization layers 126 and 128 are disposed on the signal links 176. At least one moisture-blocking hole (not shown) may be formed in the bending area BA so as to penetrate the first and second planarization layers 126 and 128. The moisture-blocking hole is formed in at least one of the region between the signal links 176 or the upper portions of the signal links 176. The moisture-blocking hole prevents external moisture from permeating the active area AA through at least one of the first planarization layer 126 or the second planarization layer 128 disposed on the signal link 176. An inspection line (not shown) for use in an inspection process is formed in the bending area BA so as to have the same structure as one of the signal links 176 shown in FIGS. 7, 9A and 9B.

As described above, the multi-buffer layer 140, the lower buffer layer 112, the first gate insulation film 114, the first and second lower interlayer insulation films 116 and 118, the upper buffer layer 122 and the upper interlayer insulation film 124 are eliminated from the bending area BA through the first and second openings 192 and 194. As a result of elimination of a plurality of inorganic insulation layers 140, 112, 114, 116, 118, 122 and 124, which cause cracks, from the bending area BA, it is possible to easily bend the substrate 101 without forming cracks in the bending area BA.

Figure 10A:
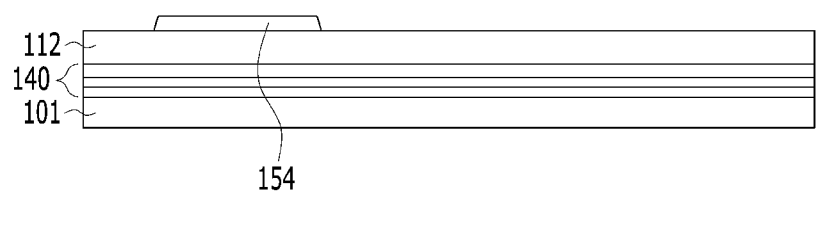
FIGS. 10A to 10N are cross-sectional views for explaining a method of manufacturing the organic light-emitting display device shown in FIGS. 7A and 7B according to one embodiment of the present disclosure.
Figure 10A:
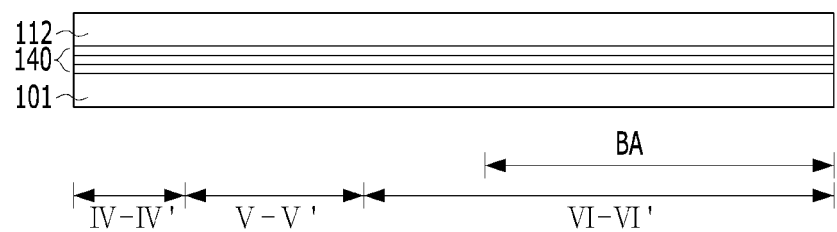
Figure 10B:
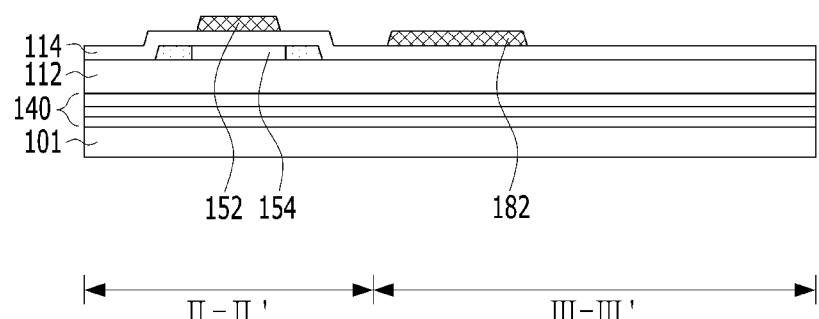
Figure 10B:
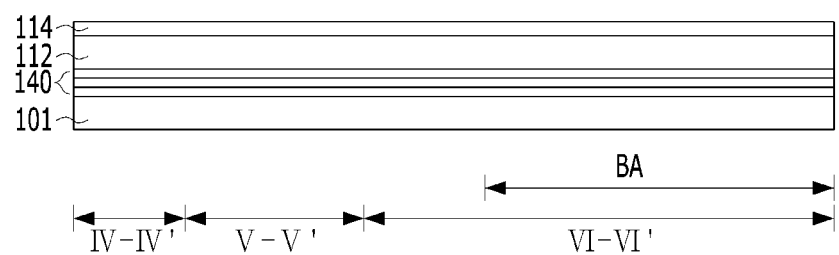
Figure 10C:
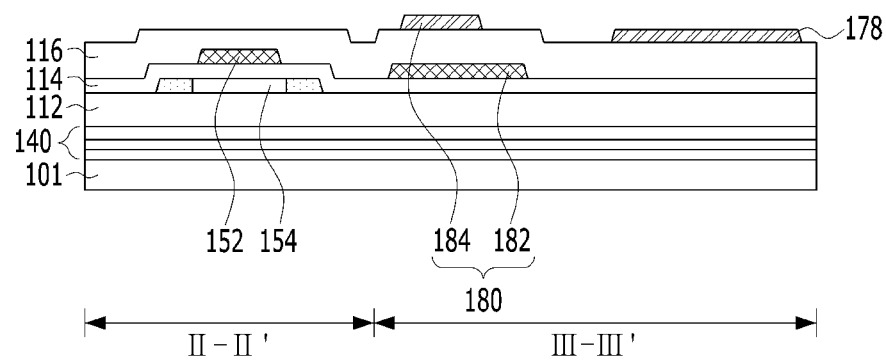
Figure 10C:
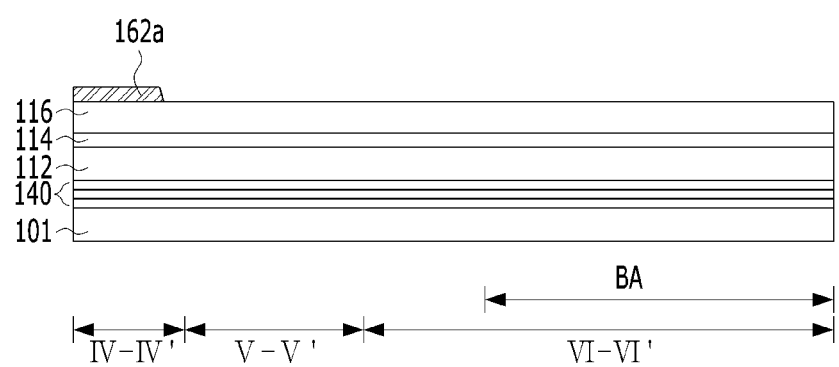
Figure 10D:
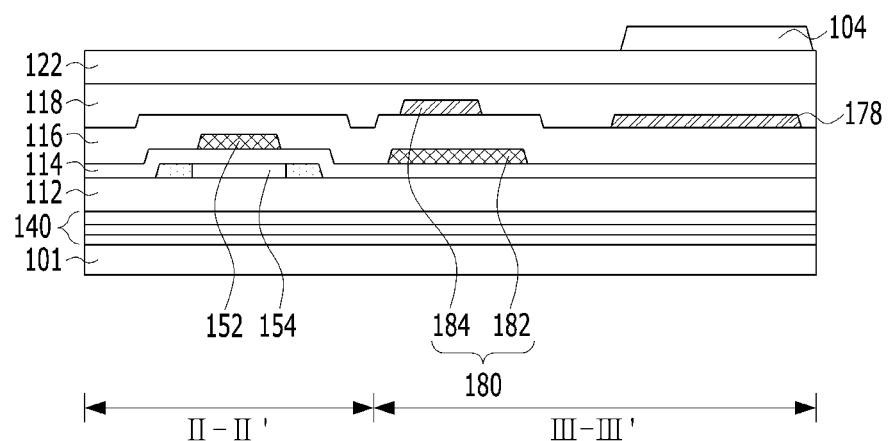
Figure 10D:
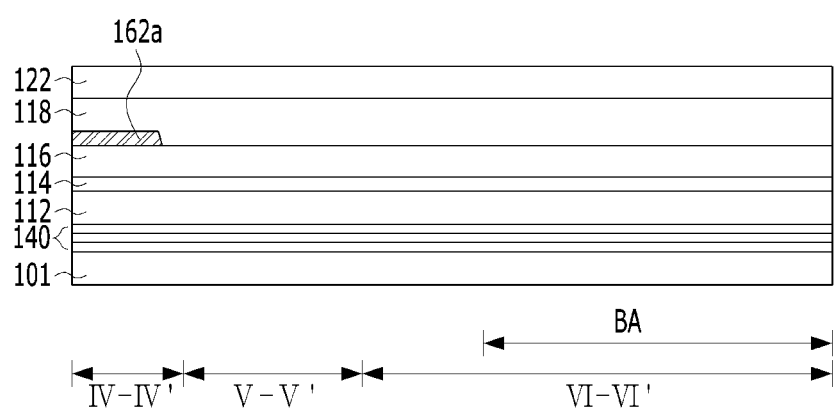
Figure 10E:
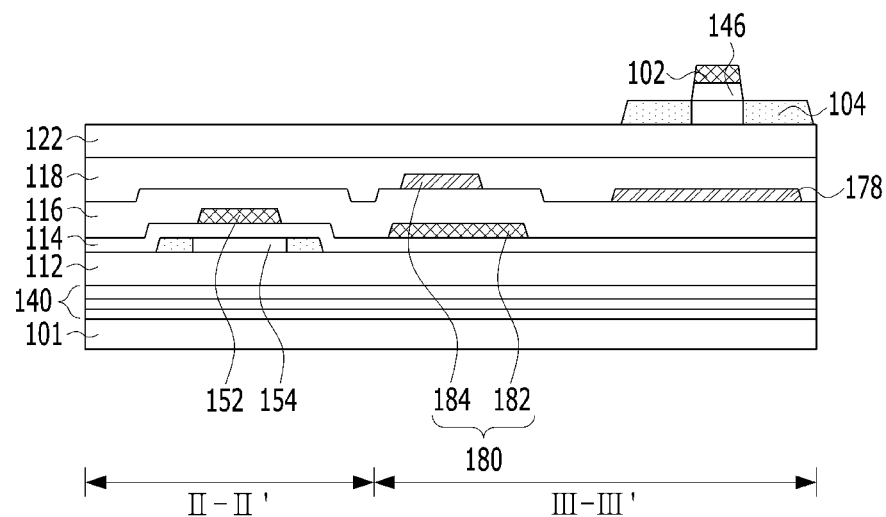
Figure 10E:
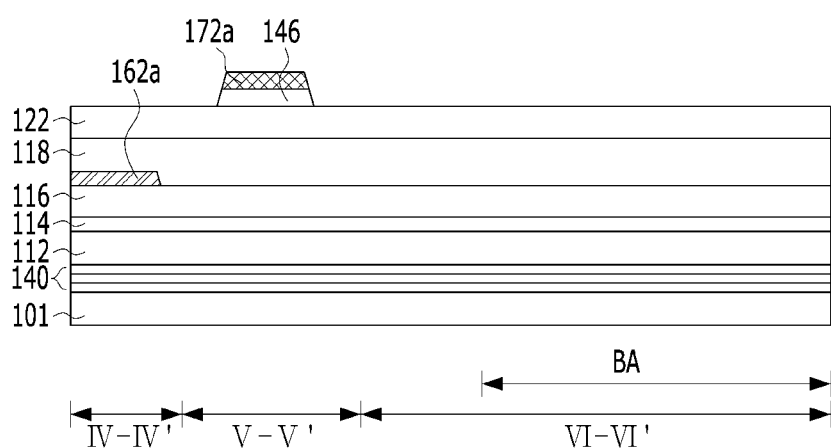
Figure 10F:
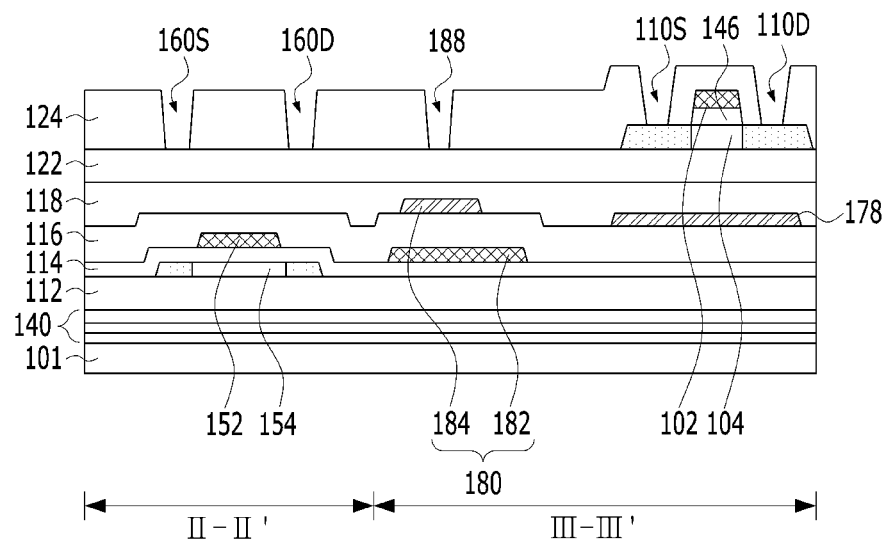
Figure 10F:
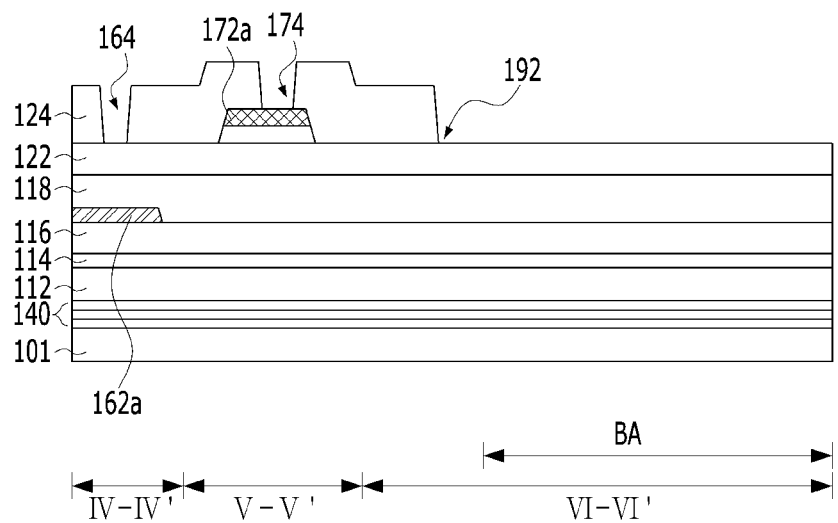
Figure 10G:
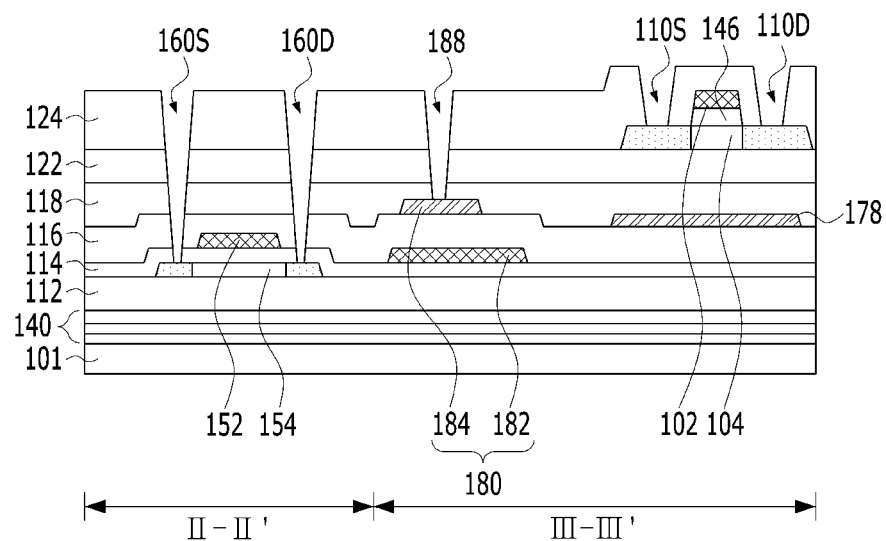
Figure 10G:
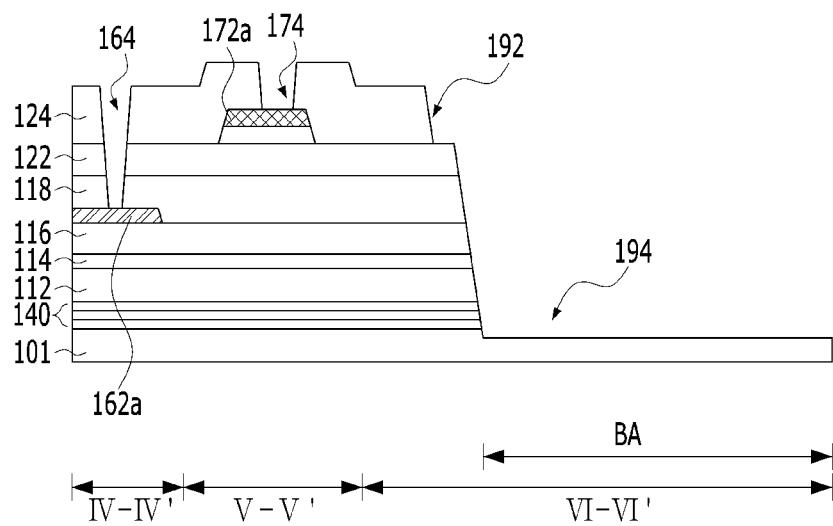
Figure 10H:
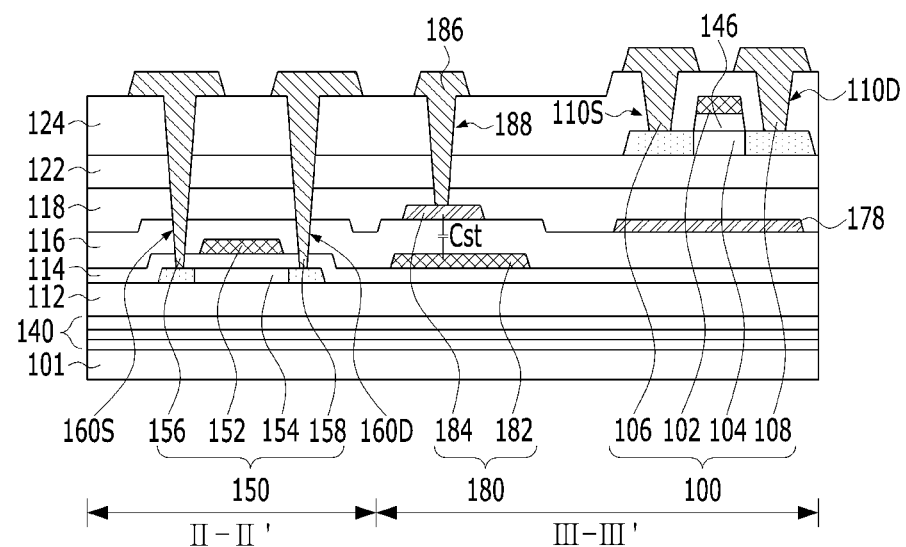
Figure 10H:
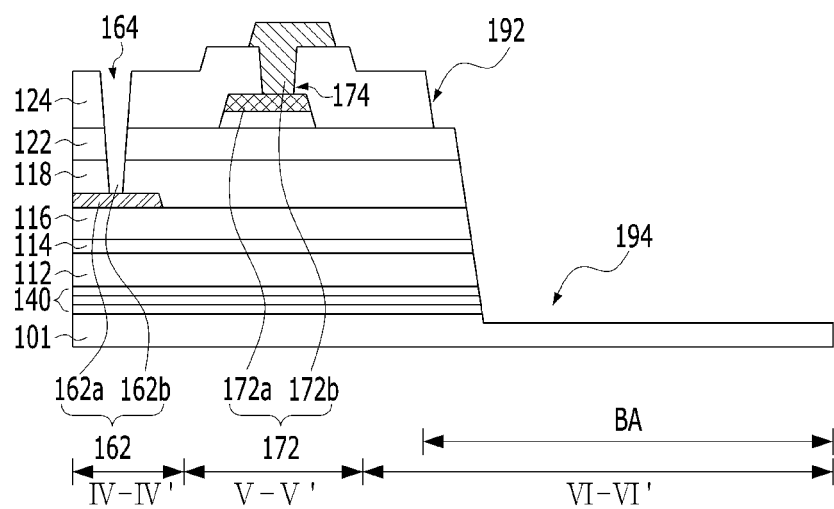
Figure 10I:
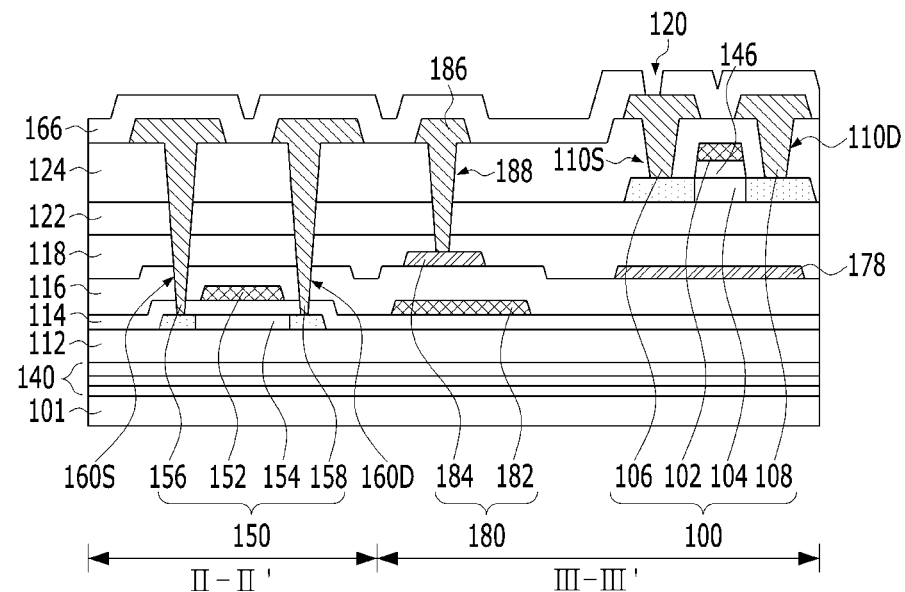
Figure 10I:
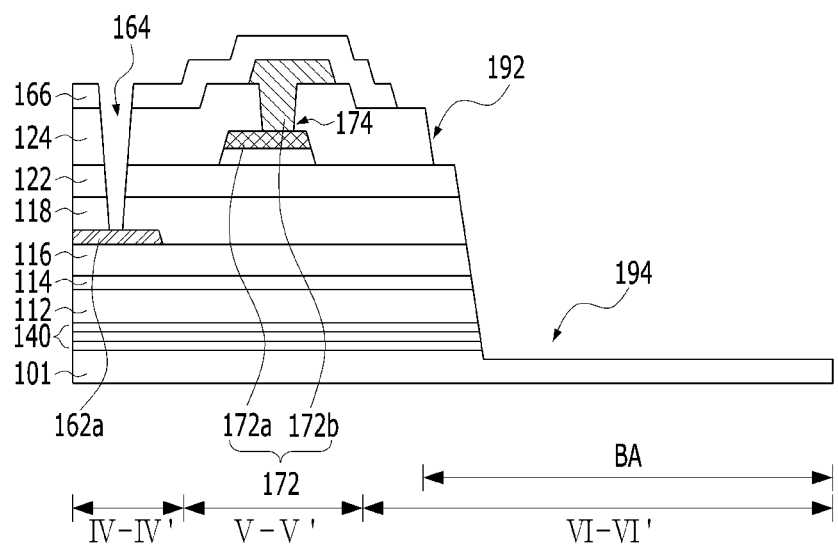
Figure 10J:
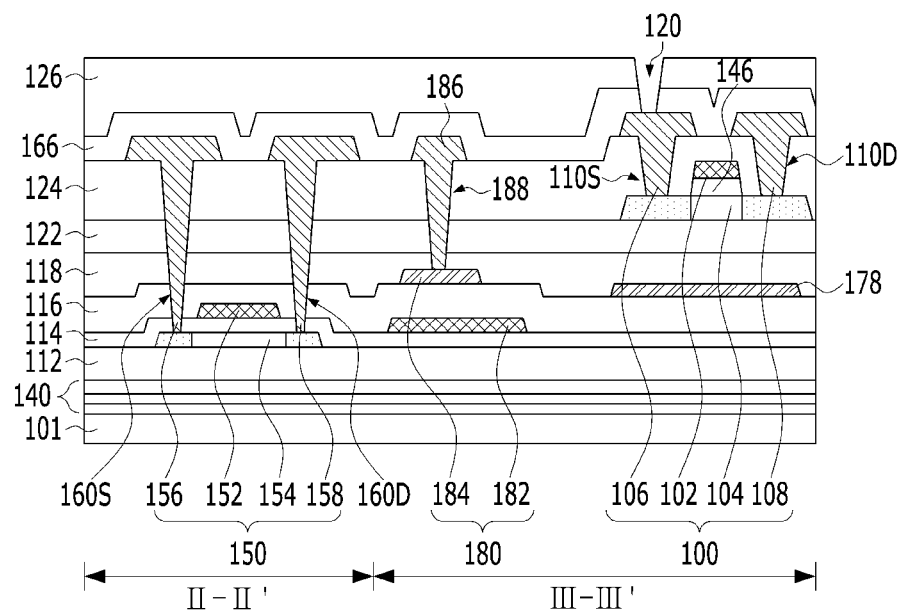
Figure 10J:
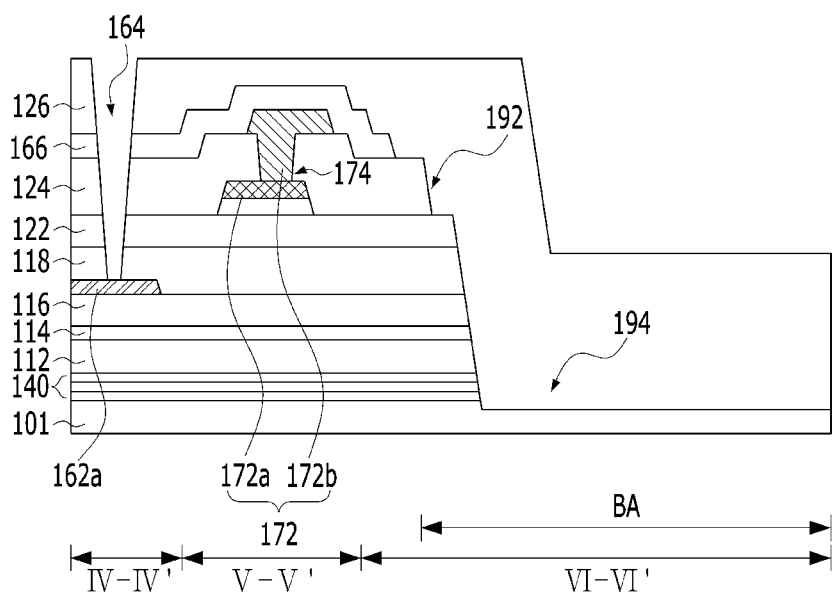
Figure 10K:
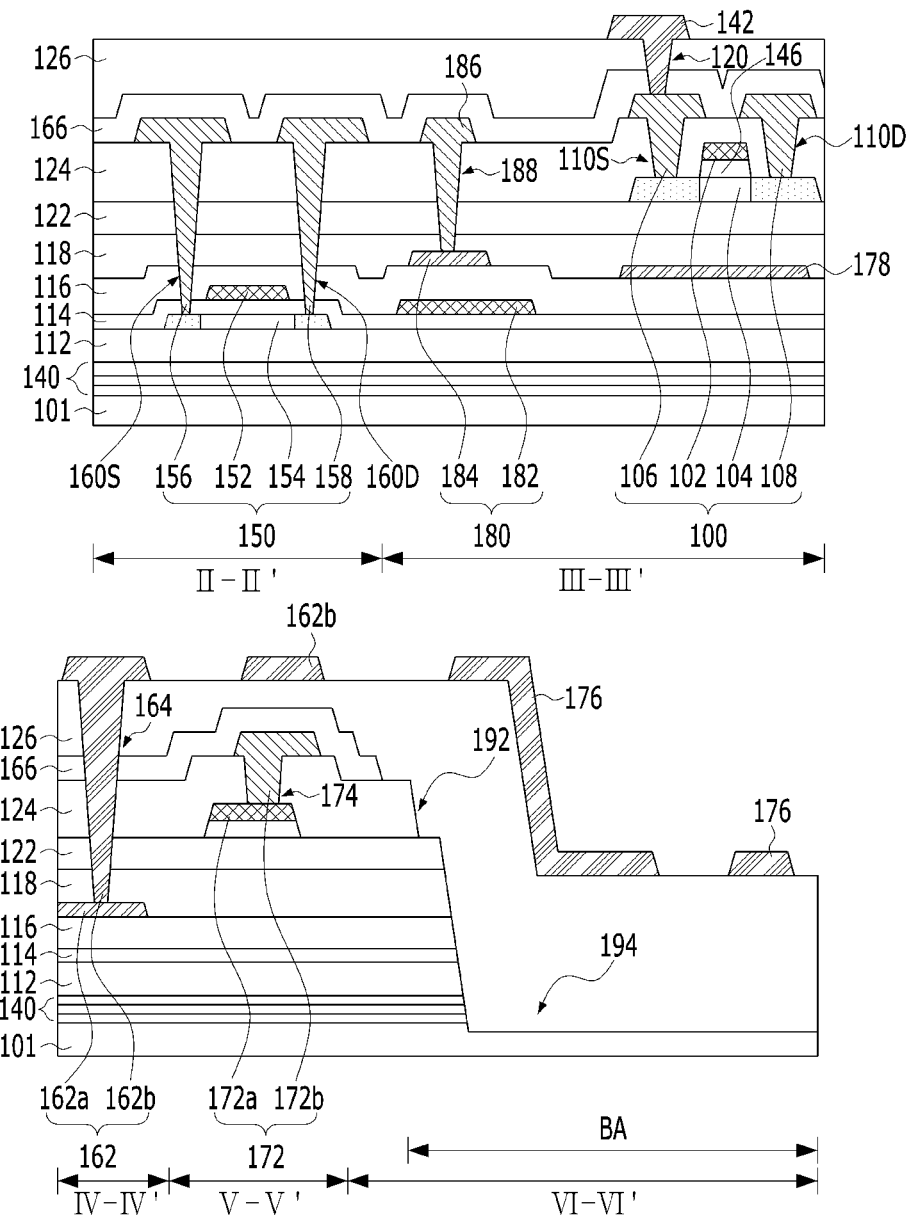
Figure 10L:
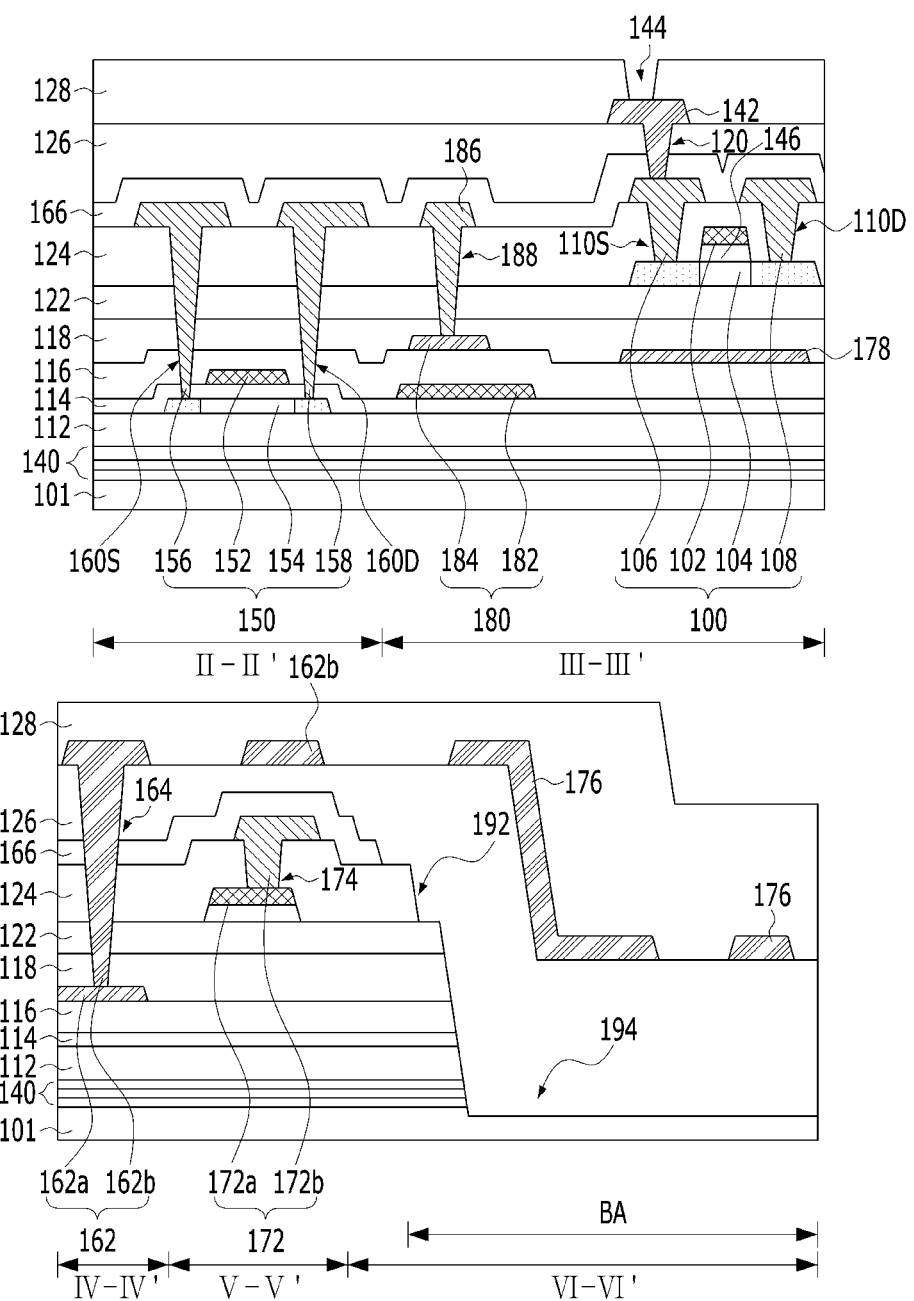
Figure 10M:
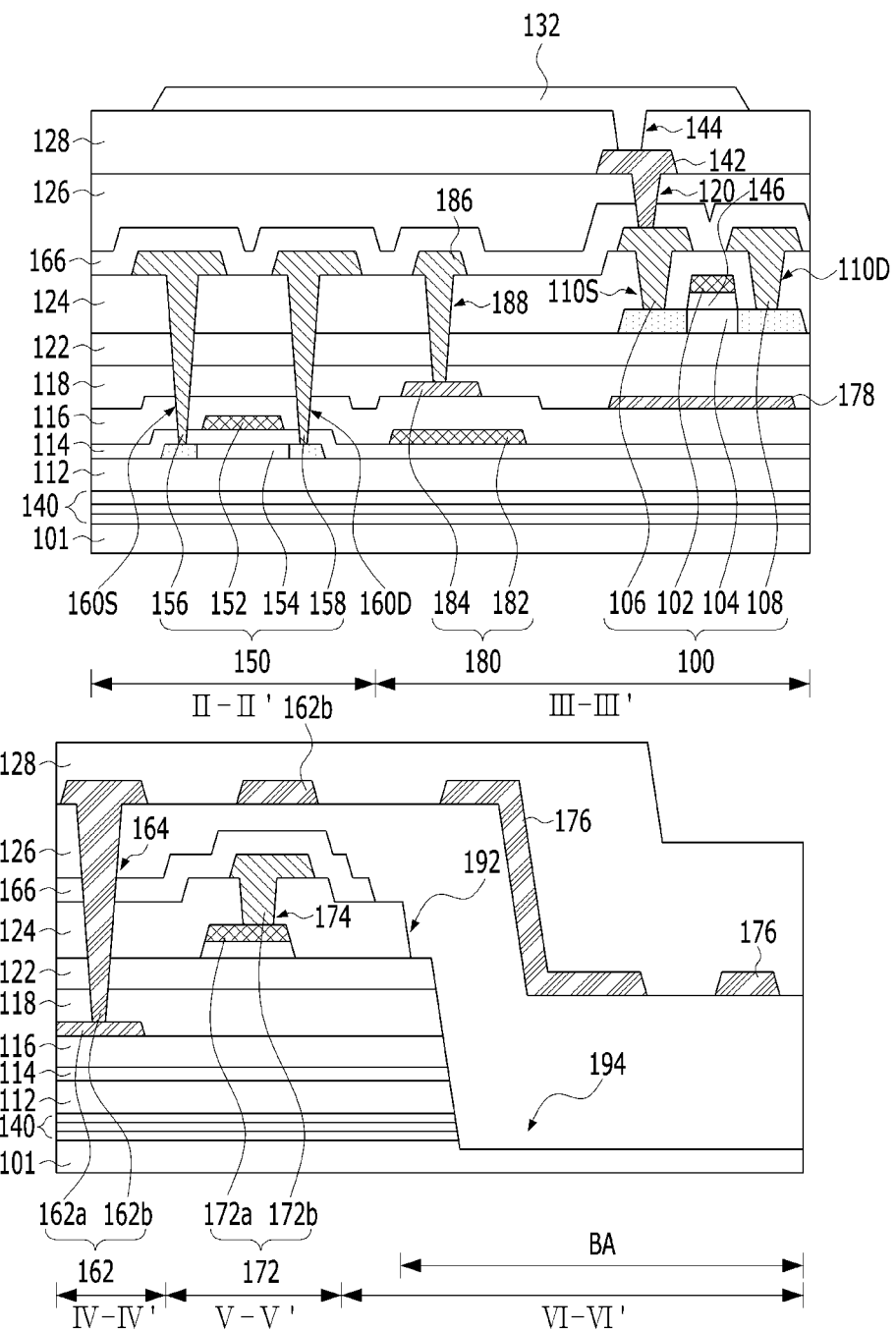
Figure 10N:
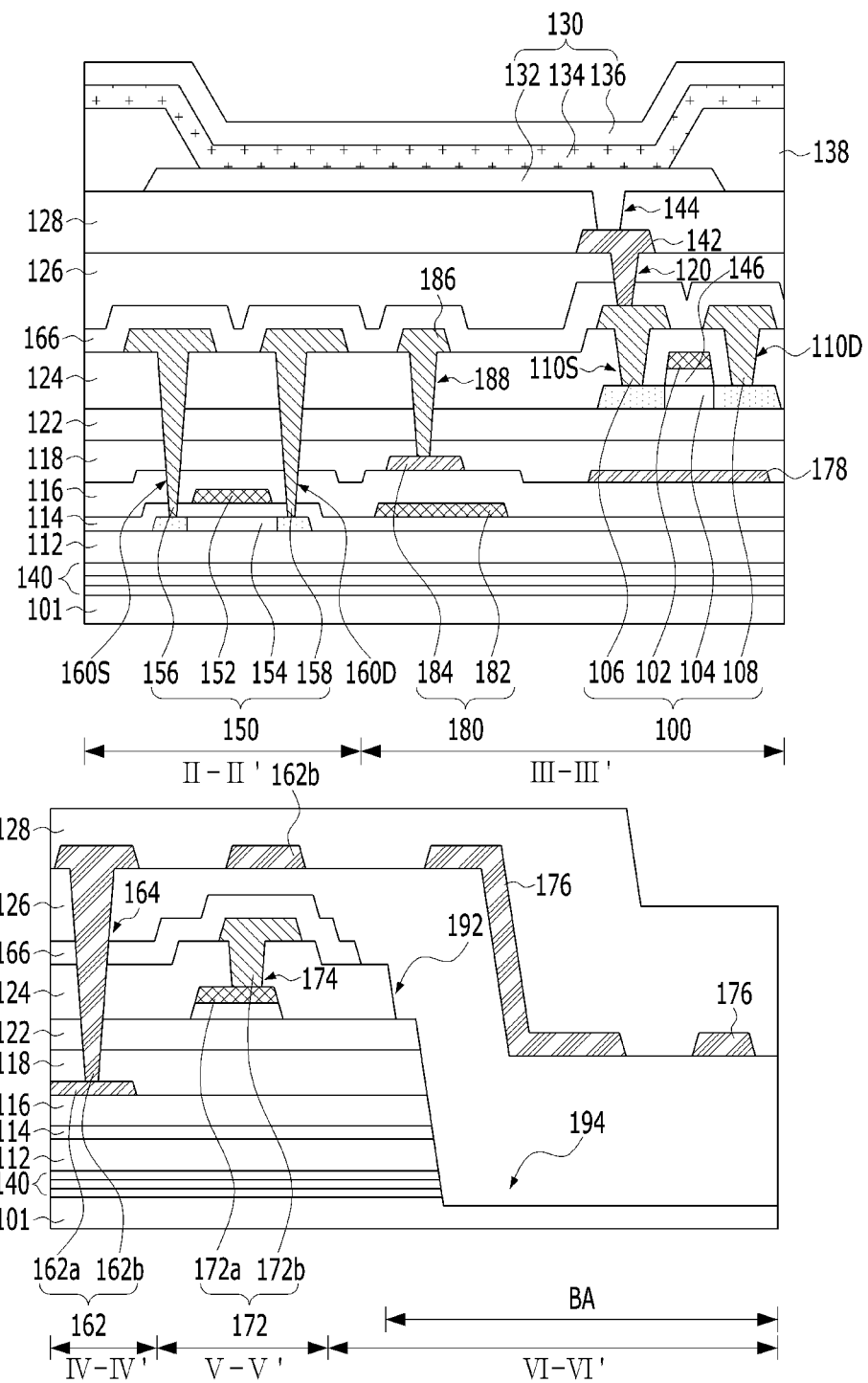

FIGS. 10A to 10N are cross-sectional views for explaining the method of manufacturing the organic light-emitting display device shown in FIG. 7.

Referring to FIG. 10A, the multi-buffer layer 140, the lower buffer layer 112 and the polycrystalline semiconductor layer 154 are sequentially formed on the substrate 101.

Specifically, the multi-buffer layer 140 is formed in a manner such that silicon oxide (SiOx) and silicon nitride (SiNx) are stacked alternately at least once on the substrate 101. Subsequently, the lower buffer layer 112 is formed in a manner such that SiOx or SiNx is deposited on the entirety of the surface of the multi-buffer layer 140. Subsequently, an amorphous silicon thin film is formed on the substrate 101, on which the lower buffer layer 112 has been formed, through a low-pressure chemical vapor deposition (LPCVD) or plasma-enhanced chemical vapor deposition (PECVD) method. Subsequently, a polycrystalline silicon thin film is formed by crystallizing the amorphous silicon thin film. Subsequently, the polycrystalline silicon thin film is patterned through a photolithography process and an etching process using a first mask so as to form the polycrystalline semiconductor layer 154.

Referring to FIG. 10B, the gate insulation film 114 is formed on the substrate 101, on which the polycrystalline semiconductor layer 154 has been formed, and the first gate electrode 152 and the lower storage electrode 182 are formed on the gate insulation film 114.

Specifically, the gate insulation film 114 is formed in a manner such that an inorganic insulation material such as SiNx or SiOx is deposited on the entirety of the surface of the substrate 101, on which the polycrystalline semiconductor layer 154 has been formed. Subsequently, a first conductive layer is deposited on the entirety of the surface of the gate insulation film 114, and is then patterned through a photolithography process and an etching process using a second mask so as to form the first gate electrode 152 and the lower storage electrode 182. Subsequently, the polycrystalline semiconductor layer 154 is doped with impurities through a doping process using the first gate electrode 152 as a mask, thereby forming the source and drain regions, which do not overlap the first gate electrode 152, and the channel region, which overlaps the first gate electrode 152.

Referring to FIG. 10C, at least one layered first lower interlayer insulation film 116 is formed on the substrate 101, on which the first gate electrode 152 and the lower storage electrode 182 have been formed, and the upper storage electrode 184, the light-shielding layer 178 and the first low potential supply line 162a are formed on the first lower interlayer insulation film 116.

Specifically, the first lower interlayer insulation film 116 is formed in a manner such that an inorganic insulation material such as SiNx or SiOx is deposited on the entirety of the surface of the substrate 101, on which the first gate electrode 152 and the lower storage electrode 182 have been formed. Subsequently, a second conductive layer is deposited on the entirety of the surface of the first lower interlayer insulation film 116, and is then patterned through a photolithography process and an etching process using a third mask so as to form the upper storage electrode 184, the light-shielding layer 178 and the first low potential supply line 162a.

Referring to FIG. 10D, at least one layered second lower interlayer insulation film 118 and the upper buffer layer 122 are sequentially formed on the substrate 101, on which the upper storage electrode 184, the light-shielding layer 178 and the first low potential supply line 162a have been formed. The oxide semiconductor layer 104 is formed on the upper buffer layer 122.

Specifically, the second lower interlayer insulation film 118 is formed in a manner such that an inorganic insulation material such as SiNx or SiOx is deposited on the entirety of the surface of the substrate 101, on which the upper storage electrode 184, the light-shielding layer 178 and the first low potential supply line 162a have been formed. Subsequently, the upper buffer layer 122 is formed in a manner such that an inorganic insulation material such as SiNx or SiOx is deposited on the entirety of the surface of the second lower interlayer insulation film 118. Subsequently, the oxide semiconductor layer 104 is deposited on the entirety of the surface of the upper buffer layer 122, and is then patterned through a photolithography process and an etching process using a fourth mask so as to form the oxide semiconductor layer 104, which overlaps the light-shielding layer 178.

Referring to FIG. 10E, the upper gate insulation pattern 146, the second gate electrode 102 and the first high potential supply line 172a are formed on the substrate 101, on which the oxide semiconductor layer 104 has been formed.

Specifically, the upper gate insulation film is formed on the substrate 101, on which the oxide semiconductor layer 104 has been formed, and a third conductive layer is formed thereon through a deposition method such as sputtering. The upper gate insulation film is formed of an inorganic insulation material such as SiOx or SiNx. The third conductive layer may have a single-layer structure or a multi-layer structure, and may be formed of a metal material such as, for example, Mo, Ti, Cu, AlNd, Al, or Cr, or an alloy thereof. Subsequently, the third conductive layer and the upper gate insulation film are patterned at the same time through a photolithography process and an etching process using a fifth mask, with the result that the upper gate insulation pattern 146 is formed under each of the second gate electrode 102 and the first high potential supply line 172a so as to have the same pattern as each of the second gate electrode 102 and the first high potential supply line 172a. At this time, during the dry etching of the upper gate insulation film, the oxide semiconductor layer 104, which does not overlap the second gate electrode 102, is exposed by plasma, and oxygen in the oxide semiconductor layer 104 exposed by plasma is eliminated through reaction to plasma gas. Accordingly, the oxide semiconductor layer 104, which does not overlap the second gate electrode 102, becomes conductive and becomes the source and drain regions.

Referring to FIG. 10F, the upper interlayer insulation film 124, which has therein the first opening 192, the first and second source contact holes 160S and 110S, the first and second drain contact holes 160D and 110D, the first storage contact hole 188 and the first and second line contact holes 164 and 174, is formed on the substrate 101, on which the upper gate insulation pattern 146, the second gate electrode 102 and the first high potential supply line 172a have been formed.

Specifically, the upper interlayer insulation film 124 is formed in a manner such that an inorganic insulation material such as SiNx or SiOx is deposited on the entirety of the surface of the substrate 101, on which the upper gate insulation pattern 146, the second gate electrode 102 and the first high potential supply line 172 have been formed. Subsequently, the upper interlayer insulation film 124 is patterned through a photolithography process and an etching process using a sixth mask so as to form the first and second source contact holes 160S and 110S, the first and second drain contact holes 160D and 110D, the first storage contact hole 188 and the first and second line contact holes 164 and 174. At the same time, the upper interlayer insulation film 124 is eliminated from the bending area BA so as to form the first opening 192. The first and second source contact holes 160S and 110S, the first and second drain contact holes 160D and 110D, the first storage contact hole 188, the first and second line contact holes 164 and 174 and the first opening 192 are formed so as to penetrate the upper interlayer insulation film 124.

Referring to FIG. 10G, the second opening 194 is formed in the bending area BA on the substrate 101, on which the upper interlayer insulation film 124 has been formed. At the same time, the gate insulation film 114, the first and second lower interlayer insulation films 116 and 118 and the upper buffer layer 122 are eliminated from the first source contact hole 160S, the first drain contact hole 160D, the first storage contact hole 188 and the second line contact hole 174.

Specifically, the gate insulation film 114, the first and second lower interlayer insulation films 116 and 118 and the upper buffer layer 122 are eliminated from the first source contact hole 160S, the first drain contact hole 160D, the first storage contact hole 188 and the second line contact hole 174 through an etching process, in which a photoresist pattern, which is formed on the substrate 101 on which the upper interlayer insulation film 124 has been formed through a photolithography process using a seventh mask, is used as a mask. At the same time, the multi-buffer layer 140, the lower buffer layer 112, the gate insulation film 114, the first and second lower interlayer insulation films 116 and 118 and the upper buffer layer 122 are eliminated from the bending area BA so as to form the second opening 194. Upon the formation of the second opening 194, a portion of the substrate 101 may also be eliminated.

Referring to FIG. 10H, the first and second source electrodes 156 and 106, the first and second drain electrodes 158 and 108, the storage supply line 186 and the second high potential supply line 172b are formed on the substrate 101, on which the second opening 194 has been formed.

Specifically, a fourth conductive layer, which is formed of Mo, Ti, Cu, AlNd, Al or Cr, or an alloy thereof, is deposited on the entirety of the surface of the substrate 101, on which the second opening 194 has been formed. Subsequently, the fourth conductive layer is patterned through a photolithography process and an etching process using an eighth mask so as to form the first and second source electrodes 156 and 106, the first and second drain electrodes 158 and 108, the storage supply line 186 and the second high potential supply line 172b.

Referring to FIG. 10I, the protective film 166, having therein the first pixel contact hole 120, is formed on the substrate 101, on which the first and second source electrodes 156 and 106, the first and second drain electrodes 158 and 108, the storage supply line 186 and the second high potential supply line 172b have been formed.

Specifically, the protective film 166 is formed in a manner such that an inorganic insulation material such as SiNx or SiOx is deposited on the entirety of the surface of the substrate 101, on which the first and second source electrodes 156 and 106, the first and second drain electrodes 158 and 108, the storage supply line 186 and the second high potential supply line 172b have been formed. Subsequently, the protective film 166 is patterned through a photolithography process using a ninth mask so as to form the first pixel contact hole 120, which penetrates the protective film 166. At the same time, the first line contact hole 164 is formed so as to penetrate the first planarization layer 126.

Referring to FIG. 10J, the first planarization layer 126 is formed on the substrate 101, on which the protective film 166 has been formed.

Specifically, the first planarization layer 126 is formed in a manner such that an organic insulation material such as acrylic resin is applied on the entirety of the surface of the substrate 101, on which the protective film 166 has been formed. Subsequently, the first planarization layer 126 is patterned through a photolithography process using a tenth mask so that the first pixel contact hole 120 and the first line contact hole 164 are formed so as to penetrate the first planarization layer 126.

Referring to FIG. 10K, the pixel connection electrode 142, the second low potential supply line 162b and the signal link 176 are formed on the substrate 101, on which the first planarization layer 126, having therein the first pixel contact hole 120, has been formed.

Specifically, a fifth conductive layer, which is formed of Mo, Ti, Cu, AlNd, Al or Cr, or an alloy thereof, is deposited on the entirety of the surface of the substrate 101, on which the first planarization layer 126, having therein the first pixel contact hole 120, has been formed. Subsequently, the fifth conductive layer is patterned through a photolithography process and an etching process using an eleventh mask so as to form the pixel connection electrode 142, the second low potential supply line 162b and the signal link 176.

Referring to FIG. 10L, the second planarization layer 128, having therein the second pixel contact hole 144, is formed on the substrate 101, on which the signal link 176, the pixel connection electrode 142 and the second low potential supply line 162b have been formed.

Specifically, the second planarization layer 128 is formed in a manner such that an organic insulation material such as acrylic resin is deposited on the entirety of the surface of the substrate 101, on which the signal link 176, the pixel connection electrode 142 and the second low potential supply line 162b have been formed. Subsequently, the second planarization layer 128 is patterned through a photolithography process using a twelfth mask so as to form the second pixel contact hole 144.

Referring to FIG. 10M, the anode 132 is formed on the substrate 101, on which the second planarization layer 128, having therein the second pixel contact hole 144, has been formed.

Specifically, a sixth conductive layer is deposited on the entirety of the surface of the substrate 101, on which the second planarization layer 128, having therein the second pixel contact hole 144, has been formed. A transparent conductive film and an opaque conductive film are used for the sixth conductive layer. Subsequently, the sixth conductive layer is patterned through a photolithography process and an etching process using a thirteenth mask so as to form the anode 132.

Referring to FIG. 10N, the bank 138, the organic light-emitting stack 134 and the cathode 136 are sequentially formed on the substrate 101, on which the anode 132 has been formed.

Specifically, a bank photosensitive film is applied on the entirety of the surface of the substrate 101, on which the anode 132 has been formed. Subsequently, the bank photosensitive film is patterned through a photolithography process using a fourteenth mask so as to form the bank 138. Subsequently, the light-emitting stack 134 and the cathode 136 are sequentially formed in the active area AA, rather than in the non-active area NA, through a deposition process using a shadow mask.

As described above, according to the present disclosure, the first opening 192 in the bending area and the second source and drain contact holes 110S and 110D are formed through the same single mask process, the second opening 194 in the bending area and the first source and drain contact holes 160S and 160D are formed through the same single mask process, the first source and drain electrodes 156 and 158 and the second source and drain electrodes 106 and 108 are formed through the same single mask process, and the storage contact hole 188 and the first source and drain contact holes 160S and 160D are formed through the same single mask process. In this way, the organic light-emitting display device according to the present disclosure may reduce the number of mask processes by a total of at least 4 times compared to the related art, thereby simplifying the structure and manufacturing process of the device and consequently achieving enhanced productivity.

As is apparent from the above description, according to the present disclosure, a second thin-film transistor including an oxide semiconductor layer is applied to a driving transistor of each sub-pixel, and a first thin-film transistor including a polycrystalline semiconductor layer is applied to a switching transistor of each sub-pixel, whereby power consumption is reduced. Further, openings located in a bending area and a plurality of contact holes located in an active area are formed through the same mask process, and thus the openings and the contact holes are formed so as to have the same depth. Accordingly, the structure and manufacturing process of the device according to the present disclosure may be simplified, and productivity may therefore be enhanced. Furthermore, according to the present disclosure, a protective film formed of an inorganic insulation material and a first planarization layer formed of an organic insulation material are disposed between a high potential supply line and a low potential supply line. Accordingly, even when a pinhole is formed in the first planarization layer, the protective film may prevent short-circuiting of the high potential supply line and the low potential supply line.

The following list of embodiments forms part of the description. These embodiments can be combined in any compatible way beyond those shown below, and with any compatible features disclosed herein.

What is claimed is:
1. A display device comprising:
  a flexible substrate comprising a display area and a non-display area surrounding the display area;
  a plurality of pixels arranged in the display area, each of the plurality of pixels including a first transistor and a second transistor, the first transistor includes a first semiconductor layer, a first gate electrode, a first source electrode, and a first drain electrode, and the second transistor includes a second semiconductor layer, a second gate electrode, a second source electrode, and a second drain electrode;
  at least one interlayer insulating layer between the first gate electrode and the second semiconductor layer; and
  a first planarization layer and a second planarization layer on the first transistor and the second transistor,
  wherein the non-display area includes a gate driver positioned on a first side of the display area and a bending portion positioned on a second side of the display area,
  wherein the first planarization layer and the second planarization layer extend into the bending portion, and
  wherein a lower surface of the first planarization layer and an upper surface of the flexible substrate contact with each other and an upper surface of the first planarization layer and a lower surface of the second planarization layer contact with each other, in the bending portion.

2. The display device according to claim 1, further comprising:
  a buffer layer between the first gate electrode and the second semiconductor layer,
  wherein the at least one interlayer insulating layer includes a first interlayer insulating layer and a second interlayer insulating layer on the first interlayer insulating layer.

3. The display device of claim 2, wherein the first interlayer insulating layer, the second interlayer insulating layer, and the buffer layer comprise silicon oxide or silicon nitride.

4. The display device according to claim 2, further comprising:
a light-shielding layer between the first interlayer insulating layer and the second semiconductor layer.

5. The display device according to claim 4, further comprising:
a first gate insulation film between the first semiconductor layer and the first gate electrode.

6. The display device according to claim 5, further comprising:
a lower storage electrode on the first gate insulation film; and
an upper storage electrode on the first interlayer insulating layer, the upper storage electrode overlapping with the lower storage electrode with the first interlayer insulation layer interposed therebetween.

7. The display device according to claim 6, wherein the upper storage electrode is in a same plane as the light-shielding layer and comprises a same material as the light-shielding layer.

8. The display device of claim 1, wherein the first semiconductor layer includes a polycrystalline semiconductor layer.

9. The display device of claim 1, wherein the second semiconductor layer includes an oxide semiconductor layer.

10. The display device of claim 1, further comprising:
a pixel connection electrode on the first planarization layer, the pixel connection electrode connecting to the second source electrode through a contact hole in the first planarization layer and connecting to an anode electrode of a light emitting device through a contact hole in the second planarization layer in the display area.

11. The display device of claim 10, wherein the bending portion includes a signal link connecting a signal line disposed in the display area and a signal pad disposed in non-display area.

12. The display device according to claim 11, wherein the signal link is in a same plane as the pixel connection electrode and comprises a same material as the pixel connection electrode.

13. The display device according to claim 1, wherein the gate driver includes a third transistor, the third transistor having a polycrystalline semiconductor layer.

* * * * *